United States Patent [19]
Hirabayashi

[11] Patent Number: 6,011,751
[45] Date of Patent: Jan. 4, 2000

[54] SYCHRONOUS SEMICONDUCTOR MEMORY DEVICE WITH BURST ADDRESS COUNTER OPERATING UNDER LINEAR/INTERLEAVE MODE OF SINGLE DATA RATE/DOUBLE DATA RATE SCHEME

[75] Inventor: Osamu Hirabayashi, Yokohama, Japan

[73] Assignee: Kabushiki Kaisha Toshiba, Kawasaki, Japan

[21] Appl. No.: 09/217,351

[22] Filed: Dec. 21, 1998

[30]   Foreign Application Priority Data

Dec. 25, 1997  [JP]  Japan .................................. 9-358544

[51] Int. Cl.$^7$ ...................................................... G11C 8/04
[52] U.S. Cl. .................... 365/236; 365/233; 365/230.02; 365/230.06; 365/230.08
[58] Field of Search .................................... 365/236, 233, 365/230.02, 230.08, 230.06

[56]          References Cited

U.S. PATENT DOCUMENTS 5,243,576  9/1993  Ishikawa .................................. 365/222

*Primary Examiner*—Andrew Q. Tran

[57]          ABSTRACT

A burst address counter comprising first to fourth decoder circuits for decoding address signals, first to fourth multiplexer circuits having first to third input terminals to receive the decoded address signals output from the first to fourth decoder circuits from the first input terminals, respectively, and selectively output one of input signals input to the first to third input terminals, first to fourth register circuits for storing output signals representing a burst address and output from the first to fourth multiplexer circuits, respectively, a first interconnection used in linear and interleave modes of single data rate scheme and connected to input the output signal stored in the first register circuit to the second input terminal of the fourth multiplexer circuit and the output signals stored in the second to fourth register circuits to the second input terminals of the first to third multiplexer circuits, respectively, and a second interconnection used in the interleave mode of single data rate scheme and connected to input the output signals stored in the first to third register circuits to the third input terminals of the second to fourth multiplexer circuits, respectively, and the output signal stored in the fourth register circuit to the third input terminal of the first multiplexer circuit.

21 Claims, 14 Drawing Sheets

LINEAR MODE (SDR MODE)

|  | 1 | 2 | 3 | 4 | 5 | ... |
|---|---|---|---|---|---|---|
| (A1, A0) | (0,0) | (0,1) | (1,0) | (1,1) | (0,0) | ... |
|  | (0,1) | (1,0) | (1,1) | (0,0) | (0,1) | ... |
|  | (1,0) | (1,1) | (0,0) | (0,1) | (1,0) | ... |
|  | (1,1) | (0,0) | (0,1) | (1,0) | (1,1) | ... |

FIG. 1 PRIOR ART

INTERLEAVE MODE (SDR MODE)

|  | 1 | 2 | 3 | 4 | 5 | ... |
|---|---|---|---|---|---|---|
| (A1, A0) | (0,0) | (0,1) | (1,0) | (1,1) | (0,0) | ... |
|  | (0,1) | (0,0) | (1,1) | (1,0) | (0,1) | ... |
|  | (1,0) | (1,1) | (0,0) | (0,1) | (1,0) | ... |
|  | (1,1) | (1,0) | (0,1) | (0,0) | (1,1) | ... |

FIG. 2 PRIOR ART

LINEAR MODE (DDR MODE)

|  | 1 | 2 | 3 | ... |
|---|---|---|---|---|
| (A1, A0) | (0,0) & (0,1) | (1,0) & (1,1) | (0,0) & (0,1) | ... |
|  | (0,1) & (1,0) | (1,1) & (0,0) | (0,1) & (1,0) | ... |
|  | (1,0) & (1,1) | (0,0) & (0,1) | (1,0) & (1,1) | ... |
|  | (1,1) & (0,0) | (0,1) & (1,0) | (1,1) & (0,0) | ... |

FIG. 3 PRIOR ART

INTERLEAVE MODE (DDR MODE)
| (A1, A0) | 1 | 2 | 3 | ... |
|---|---|---|---|---|
| | (0,0) & (0,1) | (1,0) & (1,1) | (0,0) & (0,1) | ... |
| | (0,1) & (0,0) | (1,1) & (1,0) | (0,1) & (0,0) | ... |
| | (1,0) & (1,1) | (0,0) & (0,1) | (1,0) & (1,1) | ... |
| | (1,1) & (1,0) | (0,1) & (0,0) | (1,1) & (1,0) | ... |
FIG. 4 PRIOR ART
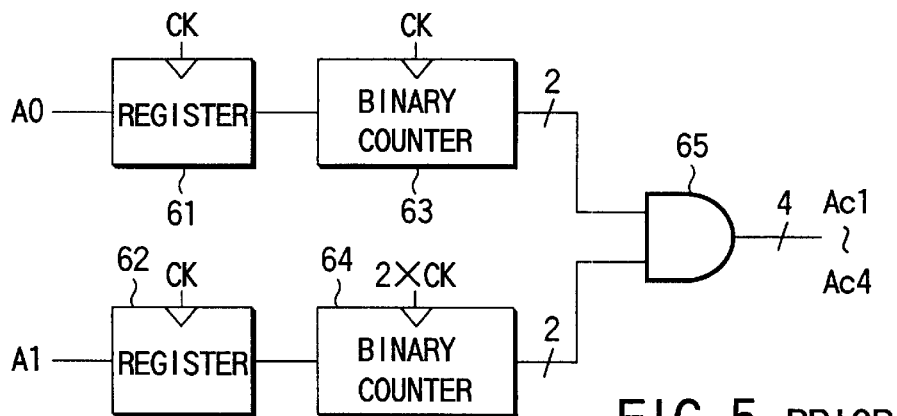
FIG. 5 PRIOR ART
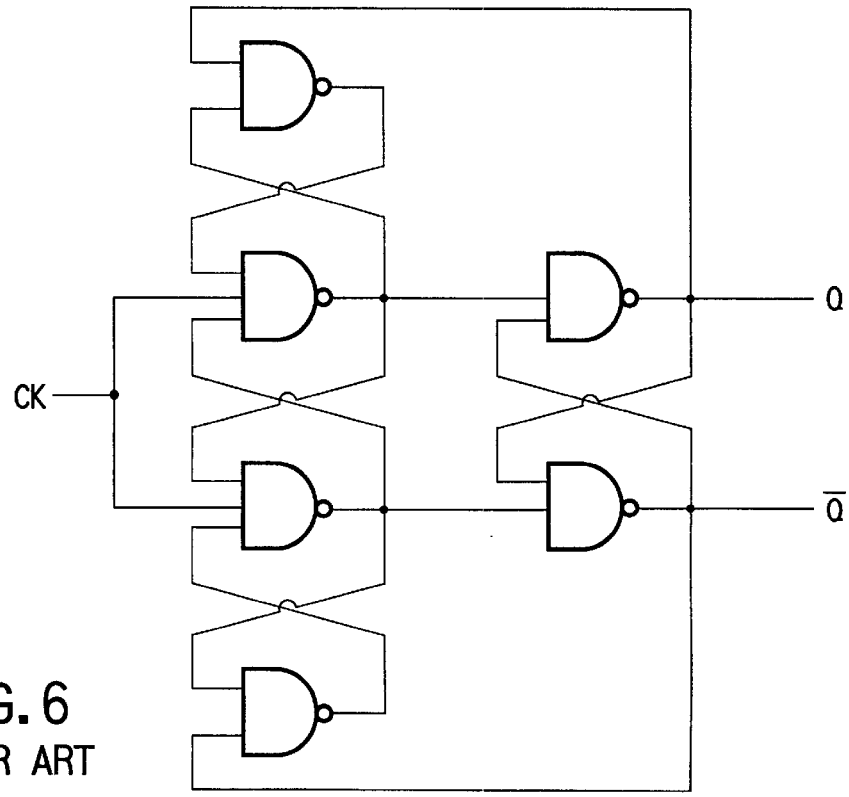
FIG. 6 PRIOR ART

SYCHRONOUS SEMICONDUCTOR MEMORY DEVICE WITH BURST ADDRESS COUNTER OPERATING UNDER LINEAR/INTERLEAVE MODE OF SINGLE DATA RATE/DOUBLE DATA RATE SCHEME

BACKGROUND OF THE INVENTION

The present invention relates to a semiconductor memory device and an address counter for generating an internal address signal for the device and, more particularly, to a synchronous semiconductor memory device operating in synchronism with an external clock input and having an operation mode in which a burst address signal is generated by itself in the memory chip on the basis of an externally supplied address signal to perform a read/write.

The present invention also relates to a burst address counter for generating a burst address signal, which is used for, e.g., an SRAM (Static RAM) having an operation mode in which a plurality of data buses are used to parallelly process data for a plurality of addresses.

In a conventional semiconductor memory, when only a normal synchronous operation mode is required, an operation mode of single data rate (SDR) scheme is supported, in which 1-bit data per input/output terminal is read/written from/in a memory cell in synchronism with only the rise of an external clock input.

As one of high-speed semiconductor memory operation schemes, a burst mode operation has been proposed. In this burst mode operation, a burst address is generated by itself in the chip on the basis of an externally supplied address signal in synchronism with a clock signal to perform a read/write.

To generate a burst address, consecutive addresses are generated in accordance with predetermined regularity (linear mode or interleave mode) on the basis of a 1- or 2-bit burst address signal.

In the burst mode period, if the burst address signal is assigned to two lower bits A1 and A0 of, e.g., an 18-bit address signal, the 16 upper address signal bits other than the address signal bits are kept fixed.

In the linear or interleave mode, a lower bit of a burst address signal alternately has a value 0, 1, 0, 1, . . . (or 1, 0, 1, 0, . . . ) without repeating the same value.

A burst address is often assigned to lower bits of a column address of a memory cell because it is required to quickly switch the memory cell to be selected.

A column system for selecting a column has a larger margin in terms of timing than that of a row system for selecting a word line of a cell. For this reason, the entire operation speed can be increased by assigning a burst address which takes a time to generate to the column system.

In the following description and drawing, column address bits Y1 and Y0 correspond to the burst address bits A1 and A0, respectively.

Such a burst mode operation can be applied not only to the SDR operation mode but also to an operation mode of double data rate (DDR) scheme in which data is read/written in synchronism with the up-edge (rise) and down-edge (fall) of an external clock input.

For a memory having the DDR operation mode, the internal operation speed does not particularly increase. When data is read or written in synchronism with both the rise and fall of an external clock input at only an I/O buffer, the internal operation speed of the memory appears to double (data read/write rate doubles) when viewed outside the memory. As such a memory, an SRAM has been proposed.

In an SRAM having the DDR operation mode, data corresponding to a plurality of addresses are parallelly processed using a plurality of data buses. The internal operation itself such as an actual data write in a memory cell is performed at the same speed (frequency) as that of an external clock input. However, the data transfer rate is doubled by parallelly processing data corresponding to two addresses at once.

That is, in the SRAM having the DDR operation mode, the data bus in the memory is doubled, and cells designated by two consecutive addresses of a burst address are simultaneously selected for a write or read.

Many SRAMs having the DDR operation mode can select either the above-described DDR operation mode or SDR operation mode.

A method of generating a burst address will be described with reference to FIGS. 1 to 4.

(1) In the linear mode of SDR scheme, by a binary count-up operation from an external address input as a start address, the start address is sequentially incremented to change the burst address.

More specifically, as shown in FIG. 1, when the start address is (0, 0), the burst address changes in the order of (0, 0)→(0, 1)→(1, 0)→(1, 1). When the start address is (0, 1), the burst address changes in the order of (0, 1)→(1, 0)→(1, 1)→(0, 0). When the start address is (1, 0), the burst address changes in the order of (1, 0)→(1, 1)→(0, 0)→(0, 1). When the start address is (1, 1), the burst address changes in the order of (1, 1)→(0, 0)→(0, 1)→(1, 0).

(2) In the interleave mode of SDR scheme, a signal obtained by performing the binary count-up operation from the external address input as a start address to increment the start address is exclusively ORed with the external address input, so the burst address changes from the start address as shown in FIG. 2.

(3) In the linear mode of DDR scheme, as shown in FIG. 3, an address in the above-described linear mode of SDR scheme and an adjacent address, i.e., two consecutive address signals are paired and sequentially incremented from the start address to progress the burst address.

(4) In the interleave mode of DDR scheme, as shown in FIG. 4, an address in the above-described interleave mode of SDR scheme and an adjacent address, i.e., two consecutive address signals are paired and sequentially incremented from the start address to progress the burst address.

To generate a burst address signal in the linear mode, an arrangement shown in FIG. 5 can be used.

Of signal bits of an external address input, the signal bits A0 and A1 corresponding to each other are input to first and second registers 61 and 62, respectively, in synchronism with an external clock signal CK. The outputs from the registers 61 and 62 are input to first and second binary counters 63 and 64, respectively, in correspondence with each other.

In this case, the first binary counter 63 counts signal bits in synchronism with the rise of the external clock signal CK. The second binary counter 64 counts signal bits in synchronism with the rise of a clock signal 2×CK having a speed twice that of the external clock signal CK. A 2-bit count-up operation is performed by the two binary counters 63 and 64.

A 4-bit signal consisting of a 2-bit complementary signal output from the first binary counter 63 and a 2-bit complementary signal output from the second binary counter 64 is input to a decoder 65 as a NAND circuit group to generate four column decode signal bits Ac1 to Ac4.

However, as described above, operating the second binary counter 64 at a speed twice that of the external clock signal CK poses a problem of operation speed as the speed of clock signal CK increases, and therefore is inappropriate for increasing the memory operation speed.

The binary counter 63 or 64 uses, as the most common structure, a toggle (T) flip-flop (F/F) as shown in FIG. 6. The number of NAND gates used therefor is as large as six. Generation of a burst address signal is delayed due to the gate delay, and consequently, the memory operation speed (e.g., access time) is limited.

When the burst address counter is to generate a burst address signal in the interleave mode, an exclusive OR circuit is added to the output side of the arrangement as shown in FIG. 6 to perform exclusive OR between the address signal and the external address input. For this purpose, more gates are used in addition to the T F/F shown in FIG. 6. Generation of a burst address signal is delayed due to the gate delay, and consequently, the memory operation speed (e.g., access time) is limited.

As described above, in the burst address counter using the conventionally available binary counters, the number of elements used to generate a burst address signal in the linear mode of SDR scheme is large. Generation of the burst address signal is delayed due to the gate delay, and the memory operation speed is limited.

The number of elements used to generate a burst address signal in the interleave mode of SDR scheme is larger, so the memory operation speed is further limited.

To generate a burst address signal to selectively cope with the linear or interleave mode of SDR scheme, a logic gate must be added, resulting in more complex circuit arrangement. The number of elements to be used further increases to limit the memory operation speed.

To generate a burst address signal in the linear or interleave mode to selectively cope with the DDR operation mode or SDR operation mode of the burst address counter 2, the above-described problem becomes very serious.

BRIEF SUMMARY OF THE INVENTION

The present invention has been made to solve the above problem, and has as its object to provide a semiconductor memory device having a simple circuit arrangement and excellent high-speed operability and capable of selectively generating the linear or interleave mode of SDR scheme, and a burst address counter therefor.

It is another object of the present invention to provide a synchronous semiconductor memory device realized by a relatively simple circuit arrangement and capable of selectively generating a burst address signal in the linear or interleave mode of DDR scheme and increasing the memory operation speed, and a burst address counter therefor.

It is still another object of the present invention to provide a synchronous semiconductor memory device realized by a relatively simple circuit arrangement and capable of selectively generating a burst address signal in the linear or interleave mode to selectively cope with the DDR operation mode or SDR operation mode and increasing the memory operation speed, and a burst address counter therefor.

In order to achieve the above objects, according to the first aspect of the present invention, there is provided a burst address counter comprising:

first to fourth decoder circuits for decoding address signals;

first to fourth multiplexer circuits having first to third input terminals to receive the decoded address signals output from the first to fourth decoder circuits from the first input terminals, respectively, and selectively output one of input signals input to the first to third input terminals on the basis of a control signal;

first to fourth register circuits for storing output signals representing a burst address and output from the first to fourth multiplexer circuits, respectively;

a first interconnection used in linear and interleave modes of single data rate scheme and connected to input the output signal stored in the first register circuit to the second input terminal of the fourth multiplexer circuit and the output signals stored in the second to fourth register circuits to the second input terminals of the first to third multiplexer circuits, respectively; and a second interconnection used in the interleave mode of single data rate scheme and connected to input the output signals stored in the first to third register circuits to the third input terminals of the second to fourth multiplexer circuits, respectively, and the output signal stored in the fourth register circuit to the third input terminal of the first multiplexer circuit.

According to the second aspect of the present invention, there is provided a burst address counter comprising:

first multiplexer circuits each having first and second input terminals to receive an address signal from the second input terminal, select one of input signals input to the first and second input terminals, and output a first output signal representing a burst address;

first register circuits for storing the first output signals output from the first multiplexer circuits, respectively;

inverters for inverting the first output signals stored in the first register circuits and inputting the inverted output signals to the first input terminals of the first multiplexer circuits as input signals, respectively;

second multiplexer circuits each having first to third input terminals to receive the decoded address signal from the second input terminal, receive the address signal from the third input terminal, select one of input signals input to the first to third input terminals, and output a second output signal representing a burst address;

second register circuits for storing the second output signals output from the second multiplexer circuits, respectively; and inverters for inverting the second output signals stored in the second register circuits and inputting the inverted output signals to the first input terminals of the second multiplexer circuits as input signals, respectively.

According to the third aspect of the present invention, there is provided a burst address counter comprising:

first to fourth decoder circuits of a first group for decoding address signals;

first to fourth decoder circuits of a second group for decoding address signals;

first to fourth multiplexer circuits of a first group each having first to third input terminals to receive decoded output signals from the first to fourth decoder circuit of the first group from the first input terminals, respectively, receive the decoded output signals from the first to fourth decoder circuit of the second group from the second input terminals, respectively, and selectively output one of input signals to the first to third input terminals on the basis of a first multiplexer control signal as output signals representing a burst address;

first to fourth multiplexer circuits of a second group each having first to third input terminals to selectively output one of input signals to the first to third input terminals on the basis of a second multiplexer control signal as output signals to the third input terminals of the first to fourth multiplexer circuits of the first group, respectively;

first to fourth register circuits for storing the output signals from the first to fourth multiplexer circuits of the first group, respectively;

a first interconnection used in linear and interleave modes of single data rate scheme and connected to input an output signal from the first register circuit to the first input terminal of the fourth multiplexer circuit of the second group and output signals from the second to fourth register circuits to the first input terminals of the first to third multiplexer circuits of the second group, respectively;

a second interconnection used in the interleave mode of single data rate scheme and connected to input the output signals from the first to third register circuits to the second input terminals of the second to fourth multiplexer circuits of the second group, respectively, and the output signal from the fourth register circuit to the second input terminal of the first multiplexer circuit of the second group; and first to fourth inverter circuits used in linear and interleave modes of double data rate scheme to invert the output signals from the first to fourth register circuits and input the inverted output signals to the third input terminals of the first to fourth multiplexer circuits of the second group, respectively, as input signals.

According to the fourth aspect of the present invention, there is provided a burst address counter comprising:

multiplexer circuits each having first and second input terminals to selectively output one of inputs to the first and second input terminals on the basis of a multiplexer control signal;

register circuits storing output signals from the multiplexer circuits, respectively;

inverter circuits for inverting output signals from the register circuits and inputting the inverted output signals to the first input terminals of the multiplexer circuits, respectively; and decoder circuits for decoding address signals and inputting the decoded address signals to the second input terminals of some of the multiplexer circuits, respectively.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a view for explaining the change rule of a burst address signal in the linear mode of SDR scheme;

FIG. 2 is a view for explaining the change rule of a burst address signal in the interleave mode of SDR scheme;

FIG. 3 is a view for explaining the change rule of a burst address signal in the linear mode of DDR scheme;

FIG. 4 is a view for explaining the change rule of a burst address signal in the interleave mode of DDR scheme;

FIG. 5 is a circuit diagram showing a circuit for generating a burst address signal in the linear mode as a burst address signal for a conventional synchronous SRAM;

FIG. 6 is a circuit diagram showing a toggle (T) flip-flop (F/F) as the most common structure of a binary counter shown in FIG. 1;

DETAILED DESCRIPTION OF THE INVENTION

The embodiments of the present invention will be described below in detail with reference to the accompanying drawing.

Figure 7:
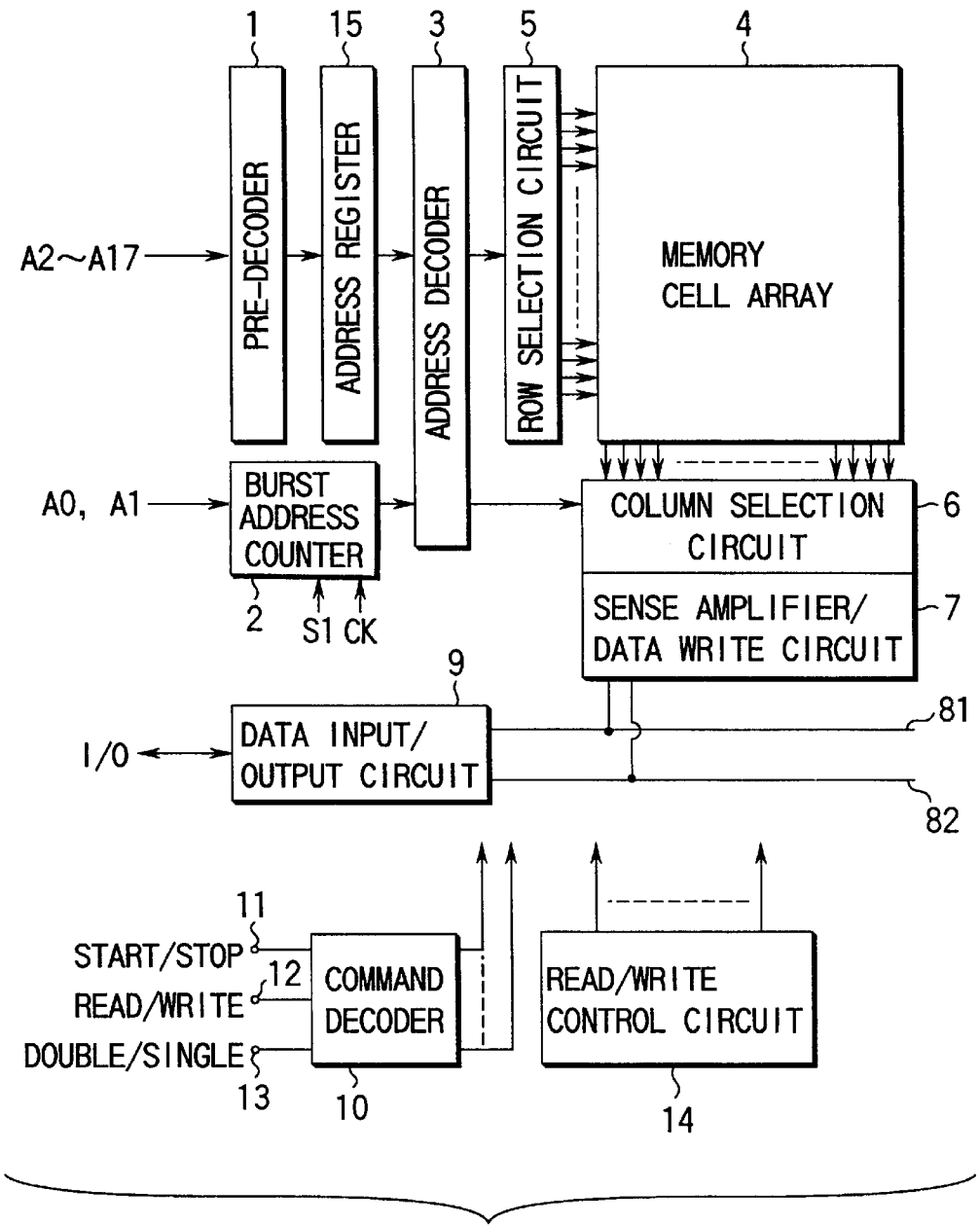
FIG. 7 is a block diagram schematically showing the overall arrangement of a synchronous SRAM according to the first embodiment of the present invention.

FIG. 7 is a block diagram schematically showing the overall arrangement of a synchronous SRAM according to the first embodiment and capable of selecting a DDR or SDR operation mode.

Referring to FIG. 7, reference symbols A0 to A17 denote least to most significant bits of an address signal. Reference numeral 1 denotes a pre-decoder for receiving 15 upper bits A17 to A2 of the address signal bits A0 to A17 and pre-decoding these address bits; 2, a burst address counter for receiving two lower bits A1 and A0, assigned as a burst address signal, of, e.g., nine column address signal bits A8 to A0 of the burst address signal bits A0 to A17; 15, an address register for receiving the output from the pre-decoder; 3, an address decoder for receiving the output from the address register 15 and the output from the burst address counter 2; 4, a memory cell array; 5, a row selection circuit for selecting rows of the memory cell array 4 in accordance with a row decoding output from the address decoder 3; 6, a column selection circuit as a column transfer gate group ON/OFF-controlled to select columns of the memory cell array 4 in accordance with the column decoding output from the address decoder 3; 7, a sense amplifier/data write circuit; 81, a first data bus; 82, a second data bus; and 9, a data input/output circuit.

A read/write control circuit 14 controls a data read/write from/in a memory cell of the memory cell array 4 in correspondence with a selected address and transfers data to the plurality of data buses 81 and 82.

The operation mode of the SRAM shown in FIG. 7 is controlled by causing a command decoder 10 to decode three control signals input from, e.g., three external terminals 11 to 13. For example, the start/stop of the burst operation is controlled in accordance with the logic level of a first control signal START/STOP, the read/write operation is controlled in accordance with the logic level of a second control signal READ/WRITE, and the DDR or SDR operation mode is selected in accordance with the logic level of a third control signal DOUBLE/SINGLE.

The pre-decoder 1 decodes, of the nine column address signal bits A8 to A0, seven bits A8 to A2 except the two lower bits A1 and A0 assigned as a burst address signal while dividing them into, e.g., three groups.

The burst address counter 2 generates a burst address signal whose start address is determined on the basis of the contents of the two input signal bits A1 and A0 in correspondence with the operation mode described above with reference to FIGS. 1 to 4. A specific example will be described later.

The memory cell array 4 is constituted by a memory cell group in which memory cells are arrayed in a two-dimensional matrix in correspondence with intersections between a plurality of word lines and bit lines. Each memory cell is a static memory cell (SRAM cell) for storing complementary data in a pair of storage nodes and transmitting/receiving data to/from a data line pair. As is well known, the SRAM cell has an NMOS transistor pair for sense drive, a PMOS transistor pair for load, and an NMOS transistor pair for data transfer gates.

Figure 8:
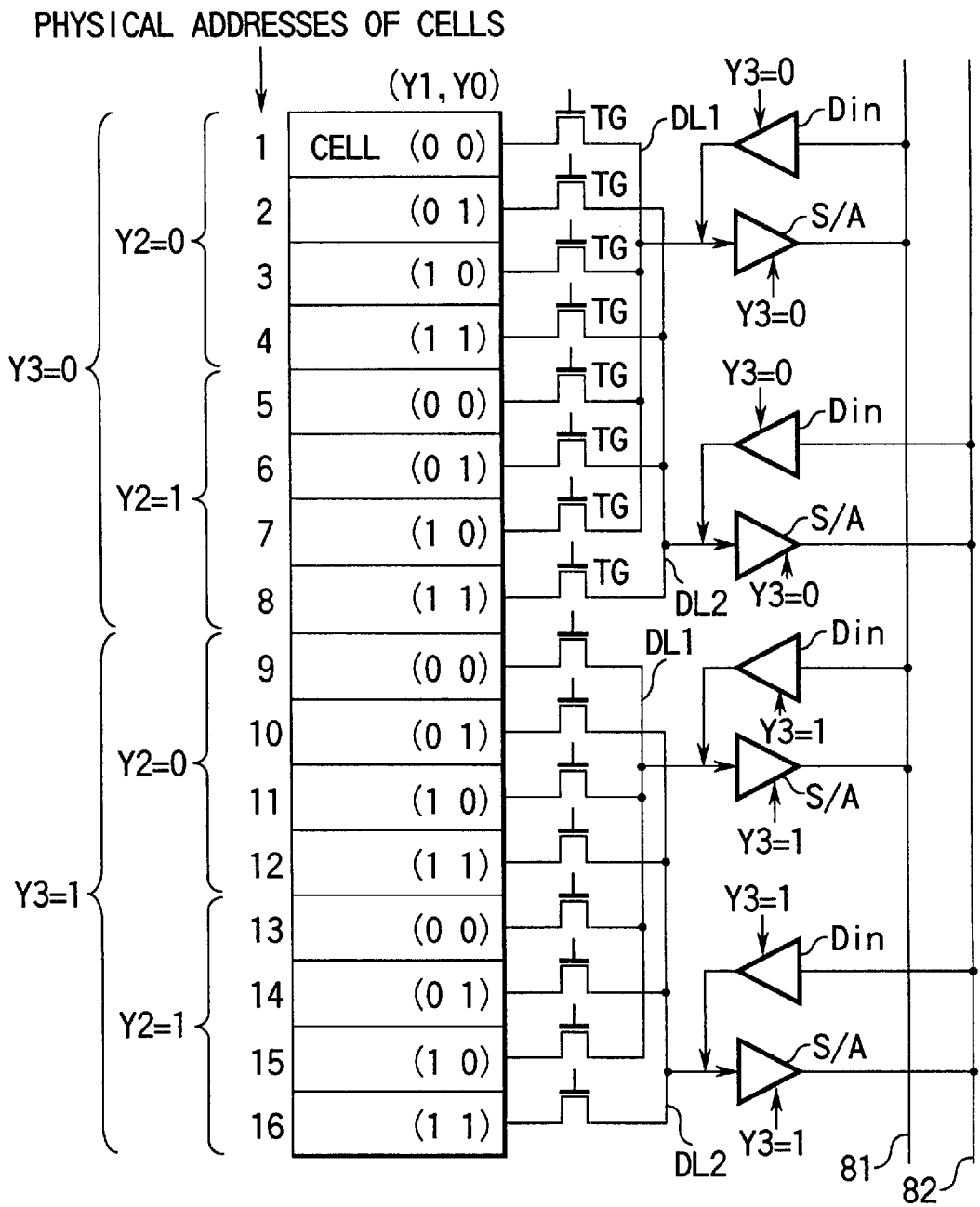
FIG. 8 is a circuit diagram showing the connection relationship among column transfer gates, data lines, sense amplifiers/data write circuits, and data buses corresponding to some cell portions of a memory cell array shown in FIG. 7.

FIG. 8 schematically shows an example of the connection relationship among column transfer gates TG, data lines DL1 and DL2, sense amplifiers S/A and data write circuits Din, and data buses corresponding to some cell portions of the memory cell array 4 in the synchronous SRAM shown in FIG. 7.

In the cell portions, four consecutive columns selected by column address signal bits Y1 and Y0 in the row direction are repeated. Four columns to be selected when an upper column address bit Y2 of the burst address bits Y1 and Y0 is at "0" and four columns to be selected when the column address bit Y2 is at "1" alternate.

Also, eight consecutive columns to be selected when an upper column address bit Y3 of the column address bit Y2 is at "0" and eight consecutive columns to be selected when the column address bit Y3 is at "1" alternate.

In the cell portions, even when memory cells corresponding to two columns are simultaneously selected by two consecutive addresses, and column transfer gates for these two bits are simultaneously opened, data congestion does not occur.

More specifically, the column transfer gate TG group is connected such that the readout data from a memory cell selected when the signal bit Y0 is at "0" can be extracted to the first data line DL1, and the readout data from a memory cell selected when the signal bit Y0 is at "1" can be extracted to the second data line DL2.

Assume that physical addresses are assigned to the memory cells in the order of array in the row direction. In this case, the column transfer gate TG group is connected such that the odd-numbered columns of the four columns are commonly connected to the first data line DL1, and the even-numbered columns are commonly connected to the second data line DL2.

The sense amplifiers S/A and data write circuits Din are connected to the first data line DL1 and second data line DL2 in units of adjacent sets (eight consecutive columns) of four columns (corresponding to physical addresses 1 to 4 or 9 to 12) to be selected when the column address bit Y2 is at "0" and four columns (corresponding to physical addresses 5 to 8 or 13 to 16) to be selected when the column address bit Y2 is at "1".

In this case, the period when the sense amplifiers S/A are activated is different from that when the data write circuits Din are activated. In addition, the period when the sense amplifiers S/A and data write circuits Din connected to the first data line DL1 are activated is different from that when the sense amplifiers S/A and data write circuits Din connected to the second data line DL2 are activated.

The plurality of sense amplifiers S/A and data write circuits Din connected to the plurality of first data lines DL1 and having different activation periods are commonly connected to the data input/output circuit 9 through the first data bus 81.

Similarly, the plurality of sense amplifiers S/A and data write circuits Din connected to the plurality of second data lines DL2 and having different activation periods are commonly connected to the data input/output circuit 9 through the second data bus 82.

Assume that switching of the sense amplifier S/A and the active/inactive state of the data write circuit Din corresponding to eight consecutive columns are controlled when Y3=0. At this time, switching of the sense amplifier S/A and the active/inactive state of the data write circuit Din corresponding to eight adjacent consecutive columns are controlled when Y3=1.

With this arrangement, each memory cell is connected to a first data bus 21 or second data bus 22 in accordance with a memory cell selected when the signal bit Y0 is at "0" or a memory cell selected when the signal bit Y0 is at "1".

Between two cells designated by two consecutive addresses (e.g., the burst start address and the next address subsequent to the start address) of the burst address and the data input/output circuit 9, a write or read can be simultaneously performed through the two data buses 81 and 82 (i.e., a write or read can be simultaneously performed without any congestion of two cell data).

Figure 9:
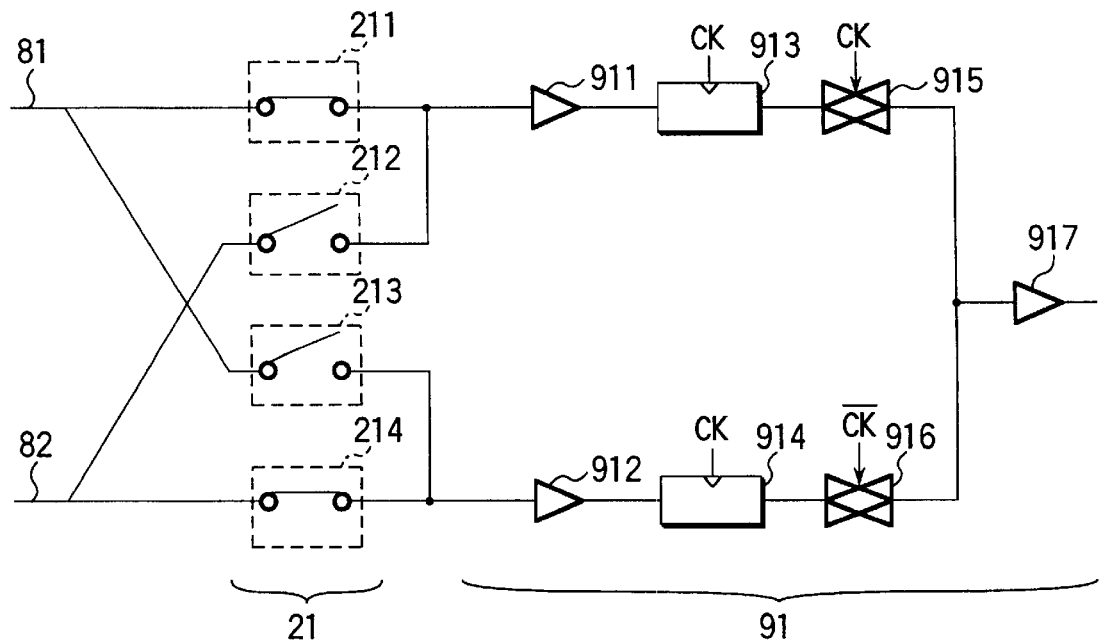
FIG. 9 is a circuit diagram showing a first data bus switching circuit and data output control circuit in a data input/output circuit shown in FIG. 7.
Figure 12:
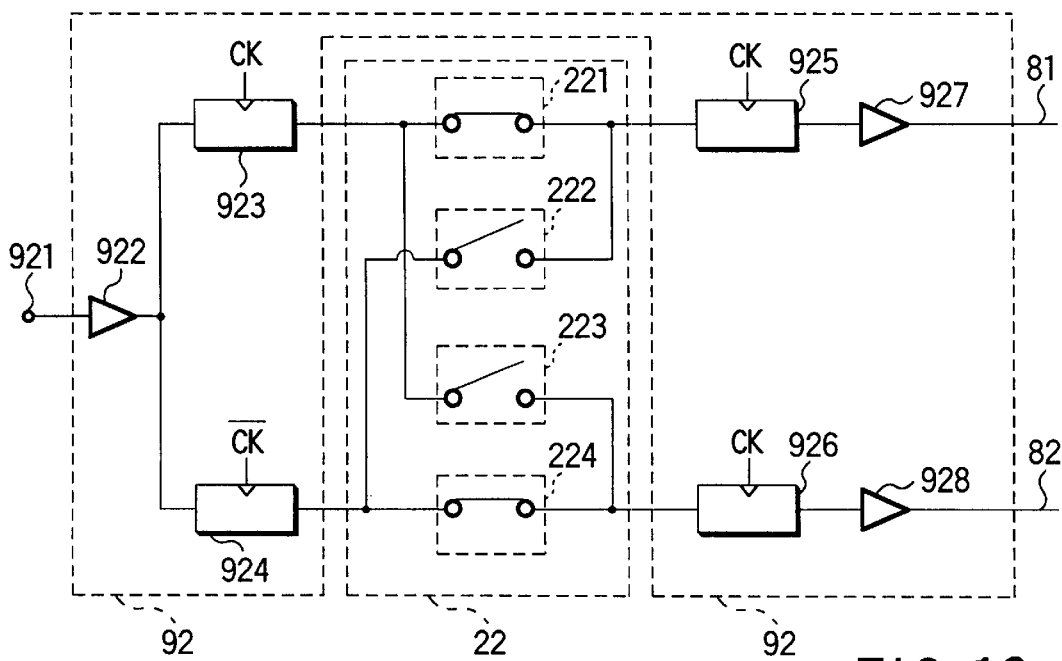
FIG. 12 is a circuit diagram showing a second data bus switching circuit and data input control circuit in the data input/output circuit shown in FIG. 7.

The data input/output circuit 9 in the synchronous SRAM shown in FIG. 7 has a first data bus control circuit 21 as an input section as shown in FIG. 9 and a second data bus control circuit 22 as an output section as shown in FIG. 12.

Referring to FIG. 9, the first data bus control circuit 21 controls the connection circuit between the two data buses 81 and 82 between the memory cell array 4 and output data registers 913 and 914 in a data output control circuit 91 of the data input/output circuit 9 (in this example, on the input side of data line sense amplifiers of the data output control circuit 91 of the data input/output circuit 9), thereby arbitrarily selecting the connection relationship between a memory cell and the plurality of output data registers.

The data output control circuit 91 comprises a first data line sense amplifier 911 connected to the first data bus 81, the first output data register 913 connected to the output terminal of the first data line sense amplifier, a first transfer gate 915 connected to the output terminal of the first output data register, a second data line sense amplifier 912 connected to the second data bus 82, the second output data register 914 connected to the output terminal of the second data line sense amplifier, a second transfer gate 916 connected to the output terminal of the second output data register, and an output buffer 917 commonly connected to the output terminals of the first and second transfer gates.

The first output data register 913 and second output data register 914 receive data in synchronism with the rise of a clock signal CK. The first transfer gate 915 transfers data while the clock signal CK is at "H" level. The second transfer gate 916 transfers data while an inverted signal $\overline{CK}$ of the clock signal CK is at "H" level (while the clock signal CK is at "L" level).

The first data bus control circuit 21 is added to the input side of the data line sense amplifiers of the data output control circuit 91 and comprises a first switch circuit 211 inserted into the first data bus 81, a second switch circuit 212 inserted between the second data bus 82 and the first data bus 81, a third switch circuit 213 inserted between the first data bus 81 and the second data bus 82, and a fourth switch circuit 214 inserted into the second data bus 82.

Each switch circuit is comprised of, e.g., a MOS transistor for transfer gate and controlled to control the data bus connection relationship at a timing set independently of the timing of driving the output data registers 913 and 914.

Figure 10A:
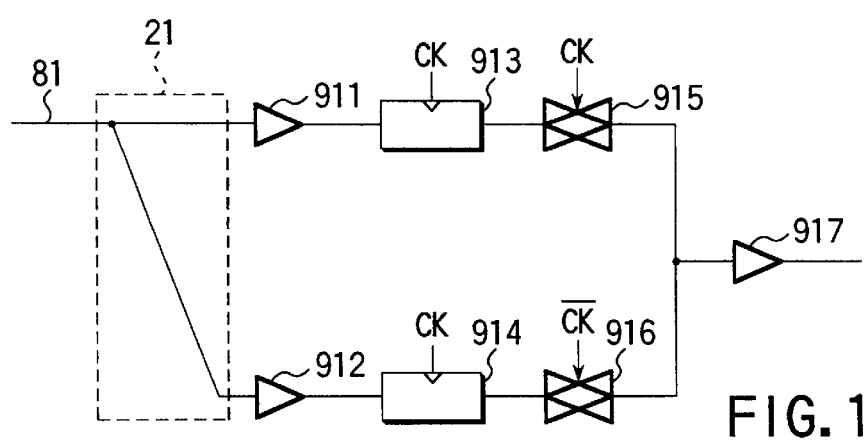
FIGS. 10A and 10B are circuit diagrams showing two forms in which the first data bus switching circuit shown in FIG. 9 controls data transfer routes in the SDR operation mode.
Figure 10B:
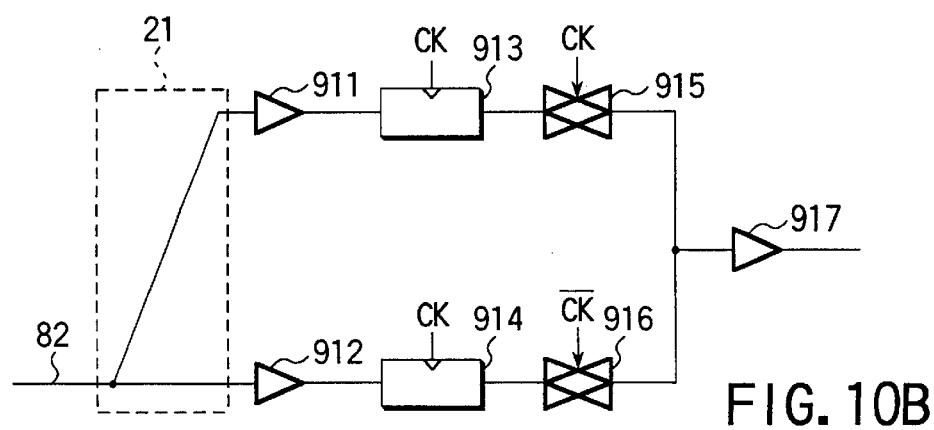

FIGS. 10A and 10B show two forms in which the first data bus control circuit 21 shown in FIG. 9 controls data transfer routes in the SDR operation mode.

FIG. 10A shows a case in which data read out from the memory cell to the first data bus 81 when the column address signal bit Y0 is at "0" is input to the two data line sense amplifiers 911 and 912 through the first switch circuit 211 and third switch circuit 213 of the first data bus control circuit 21, respectively, i.e., data on the first data bus 81 is also transferred to the second data bus 82.

FIG. 10B shows a case in which data read out from the memory cell to the second data bus 82 when the column address signal bit Y0 is at "1" is input to the data line sense amplifiers 911 and 912 through the second switch circuit 212 and fourth switch circuit 214 of the first data bus control circuit 21, respectively, i.e., data on the second data bus 82 is also transferred to the first data bus 81.

Figure 11A:
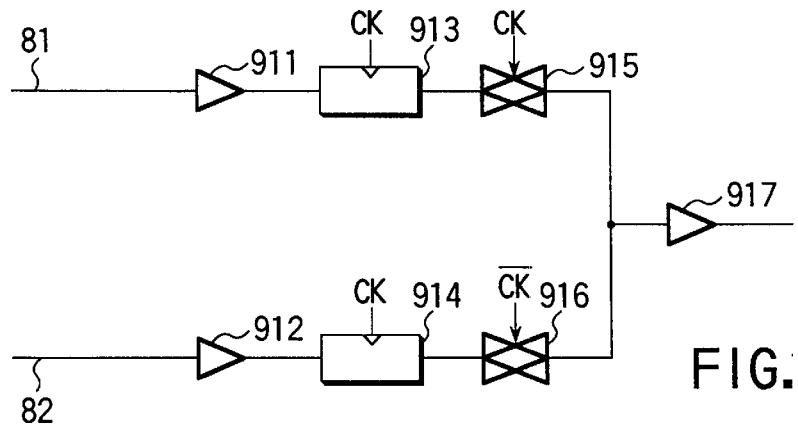
FIGS. 11A and 11B are circuit diagrams showing two forms in which the first data bus switching circuit shown in FIG. 9 controls data transfer routes in the DDR operation mode.
Figure 11B:
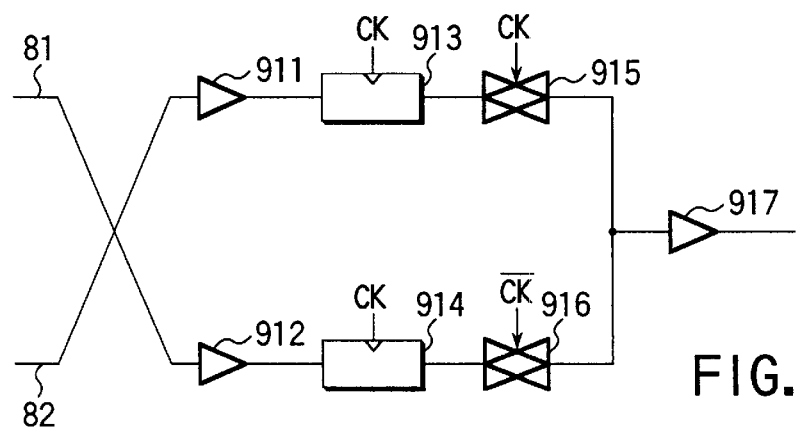

FIGS. 11A and 11B show two forms in which the first data bus control circuit 21 shown in FIG. 9 controls data transfer routes in the DDR operation mode.

FIG. 11A shows a case in which data read out from memory cells corresponding to two consecutive addresses to the first data bus 81 and second data bus 82 when the column address signal bit Y0 is at "0" are input to the two data line sense amplifiers 911 and 912 through the first switch circuit 211 and fourth switch circuit 214 of the first data bus control circuit 21, respectively, i.e., transfer buses are not switched through the first data bus control circuit 21.

FIG. 11B shows a case in which data read out from memory cells corresponding to two consecutive addresses to the first data bus 81 and second data bus 82 when the column address signal bit Y0 is at "1" are input to the two data line sense amplifiers 911 and 912 through the third switch circuit 213 and second switch circuit 212 of the first data bus control circuit 21, respectively, i.e., transfer buses are switched through the first data bus control circuit 21.

Referring to FIG. 12, the second data bus control circuit 22 controls the connection circuit between the two data buses 81 and 82 between input data registers 923 and 924 in a data input control circuit 92 of the data input/output circuit 9 and the memory cell array 4 (in this example, at the intermediate stage of input data registers in the data input control circuit 92 of the data input/output circuit 9), thereby arbitrarily selecting the connection relationship between a memory cell and the plurality of input data registers.

The second data bus control circuit 22 comprises a first switch circuit 221 inserted into the first data bus 81, a second switch circuit 222 inserted between the second data bus 82 and the first data bus 81, a third switch circuit 223 inserted between the first data bus 81 and the second data bus 82, and a fourth switch circuit 224 inserted into the second data bus 82.

Each switch circuit is comprised of, e.g., a MOS transistor for transfer gate and controlled to control the data bus connection relationship at a timing set independently of the timing of driving the input data registers 923 and 924.

Figure 13A:
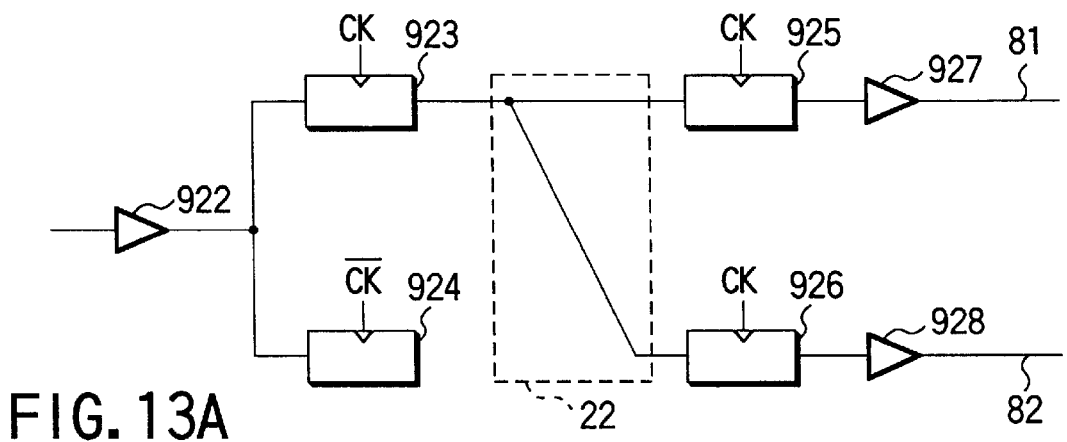
FIGS. 13A, 13B, and 13C are circuit diagrams showing a form in which the second data bus switching circuit shown in FIG. 12 controls data transfer routes in the SDR operation mode and two forms in which the second data bus switching circuit controls data transfer routes in the DDR operation mode.

FIG. 13A shows a form in which the second data bus control circuit 22 shown in FIG. 12 controls data transfer routes in the SDR operation mode.

In the SDR operation mode, data in the first input data register 923 is input to a third input data register 925 and fourth input data register 926 through the first switch circuit 221 and third switch circuit 223 of the second data bus control circuit 22, respectively, i.e., data on the first data bus 81 is also transferred to the second data bus 82.

Figure 13B:
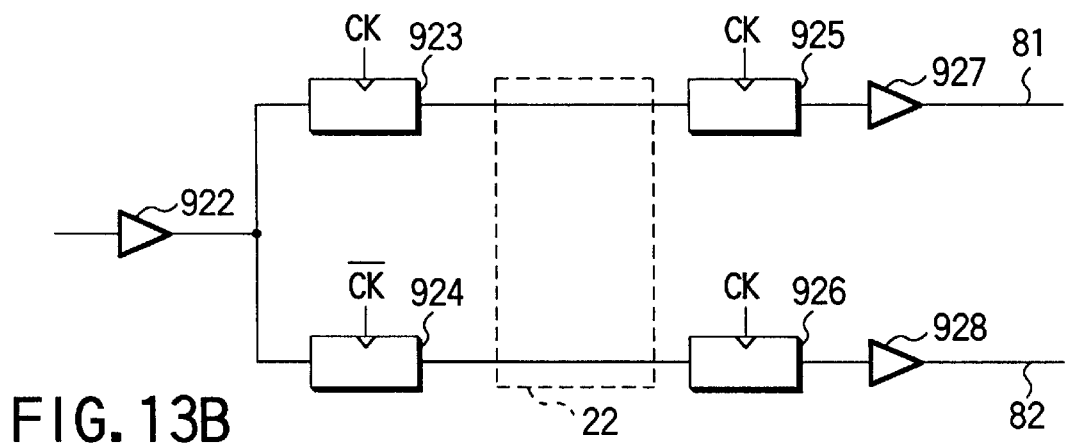
Figure 13C:
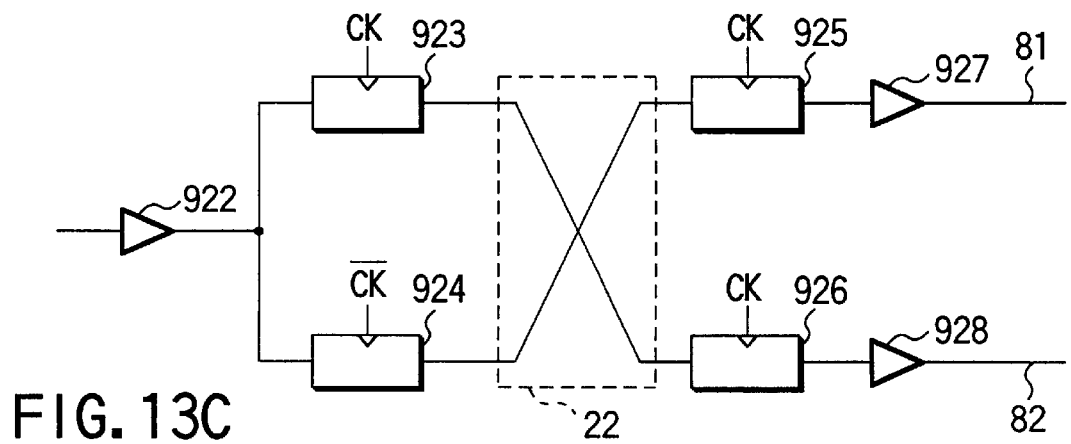

FIGS. 13B and 13C show forms in which the second data bus control circuit 22 shown in FIG. 12 controls data transfer routes in the DDR operation mode.

FIG. 13B shows a case in which input data when the column address signal bit Y0 is at "0", i.e., data corresponding to two consecutive addresses input to the first input data register 923 and second input data register 924 are input to the third input data register 925 and fourth input data register 926 through the first switch circuit 221 and fourth switch circuit 224 of the second data bus control circuit 22, respectively, i.e., the transfer buses are not switched through the second data bus control circuit 22.

FIG. 13C shows a case in which input data when the column address signal bit Y0 is at "1", i.e., data corresponding to two consecutive addresses input to the first input data register and second input data register are input to the third input data register 925 and fourth input data register 926 through the third switch circuit 223 and second switch circuit 222 of the second data bus control circuit 22, respectively, i.e., the transfer buses are switched through the second data bus control circuit 22.

<First Embodiment>

Figure 14:
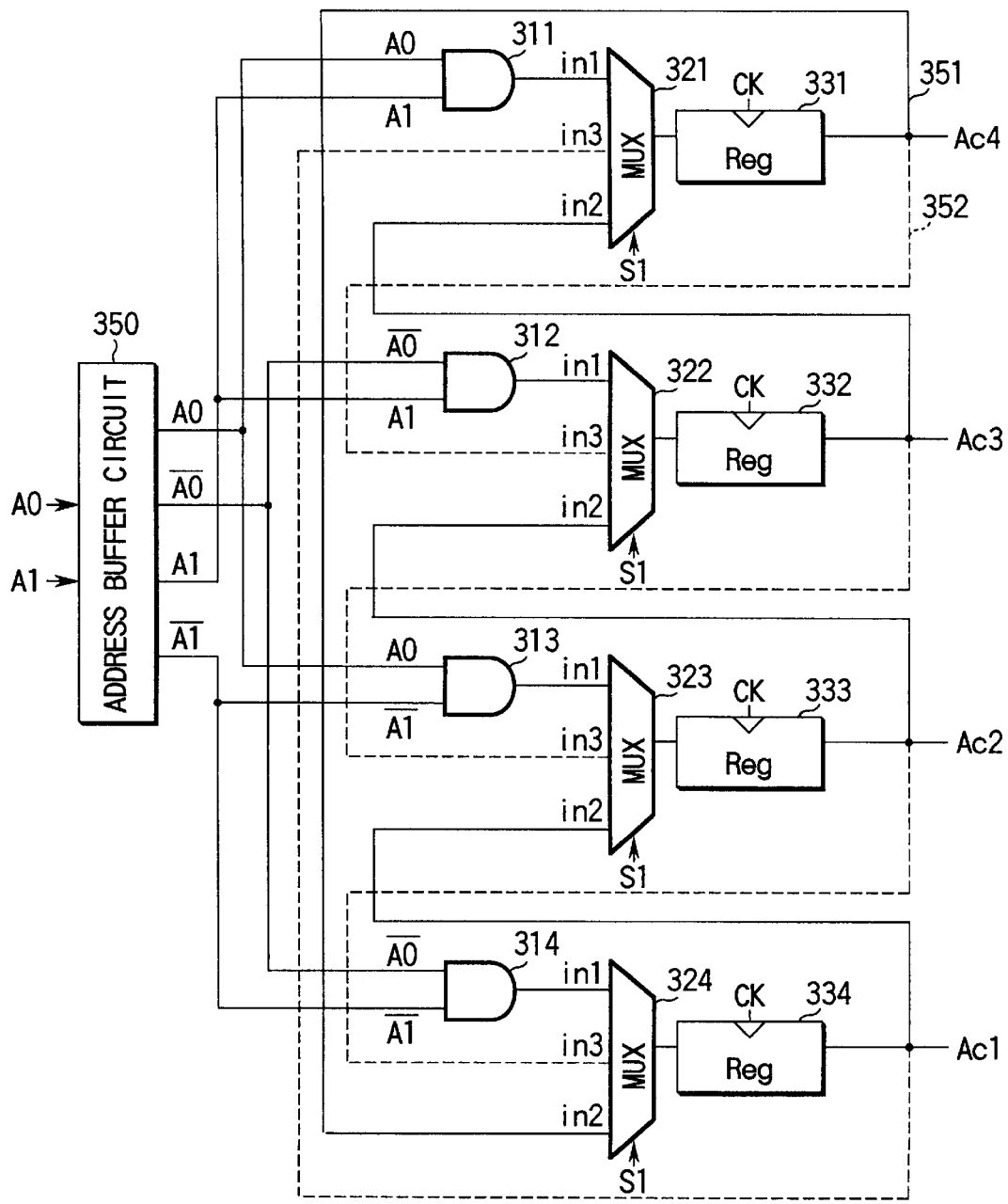
FIG. 14 is a circuit diagram showing a case in which a burst address signal in the linear or interleave mode of SDR scheme is generated by a burst address counter shown in FIG. 7.

FIG. 14 is a circuit diagram showing an example in which the burst address counter 2 shown in FIG. 7 can selectively cope with the linear or interleave mode of SDR scheme.

Referring to FIG. 14, signals A0 and A1 and inverted signals $\overline{A0}$ and $\overline{A1}$ thereof are internal address signals generated by inputting two lower signal bits of an external address signal to an address buffer circuit 350. Reference symbol CK denotes an internal clock signal supplied outside the memory chip through a buffer circuit (not shown).

Reference numerals 311 to 314 denote first to fourth two-input decoder circuits (e.g., AND circuits). The first decoder circuit 311 receives the signals A0 and A1. The second decoder circuit 312 receives the signals $\overline{A0}$ and A1. The third decoder circuit 313 receives the signals A0 and $\overline{A1}$. The fourth decoder circuit 314 receives the signals $\overline{A0}$ and $\overline{A1}$.

Reference numerals 321 to 324 denote first to fourth three-input multiplexer (MUX) circuits. The output signals from the first to fourth decoder circuits 311 to 314 are input to the first terminals (in1) of the first to fourth multiplexer circuits 321 to 324, respectively.

Reference numerals 331 to 334 denote first to fourth register (Reg) circuits for receiving the clock signal CK and receiving input signals in synchronism with the clock signal CK. The output signals from the first to fourth multiplexer circuits 321 to 324 are input to the first to fourth register circuits 331 to 334, respectively.

A first interconnection 351 forms a loop for inputting the output signals from the first to fourth register circuits 331 to 334 to the second input terminals (in2) of the fourth multiplexer circuit 324 and first to third multiplexer circuits 321 to 323, respectively.

In addition, a second interconnection 352 forms a loop for inputting the output signals from the first to fourth register circuits 331 to 334 to the third input terminals (in3) of the second to fourth multiplexer circuits 323 to 324 and first multiplexer circuit 321, respectively.

That is, the burst address counter shown in FIG. 14 comprises m (in this example, m=4) decoder circuits for decoding address signals, m multiplexer circuits each having a plurality of input terminals to receive a corresponding one of the output signals from the m decoder circuits from a first input terminal and selectively switch inputs to the plurality of input terminals and output a signal on the basis of a multiplexer control signal supplied to the control input terminal, m register circuits for receiving output signals from the m multiplexer circuits, respectively, receiving a clock signal, and receiving output signals from corresponding ones of the m multiplexer circuits, respectively, in synchronism with the clock signal, a first interconnection used in the linear or interleave mode of single data rate scheme and connected to input the output signal from the first register circuit of the m register circuits to the second input terminal of an mth multiplexer circuit of the m multiplexer circuits and input the output signals from the second to mth register circuits of the m register circuits to the second input terminals of the first to (m−1)th multiplexer circuits of the m multiplexer circuits, and a second interconnection used in the interleave mode of single data rate scheme and connected to input the output signals from the first to (m−1)th register circuits of the m register circuits to the third input terminals of the second to mth multiplexer circuits of the m multiplexer circuits and the output signal from the mth register circuit of the m register circuits to the third input terminal of the first multiplexer circuit of the m multiplexer circuits.

Each of the first to fourth multiplexer circuits 321 to 324 receives a multiplexer control signal S1 and switches and selects the input to the first input terminal (in1), second input terminal (in2), or third input terminal (in3).

In this case, at the start of the operation of the burst address counter, the signals from the first input terminals (in1) are selected to receive the start addresses to the first to fourth register circuits 331 to 334. After this, switching control is performed by the multiplexer control signal S1 to select the signals from the second input terminals (in2) in the linear mode or select the signals from the second input terminals (in2) or third input terminals (in3) in the interleave mode in accordance with the logic level of the lower address bit A0 of the address signal bits A1 and A0 at the start.

When a burst address in the linear mode of single data rate scheme is to be generated, the four multiplexer circuits are controlled to select the signals from the first input terminals at the start of the burst address generation operation and then select the signals from the second input terminals. When a burst address in the interleave mode of single data rate scheme is to be generated, the four multiplexer circuits are controlled to select the signals from the first input terminals at the start of the burst address generation operation and then select the signals from the second or third input terminals in accordance with the logic level of the lower bit of the start address.

In the linear mode, in the first cycle at the start of the operation, the start address is received in synchronism with the rise of the clock signal CK and preset in the four register circuits 331 to 334. In the subsequent cycles, a data shift operation is performed along the first interconnection 351 forming a loop in a predetermined direction in synchronism with the rise of the clock signal CK.

As a result, the four register circuits 331 to 334 output four output signal bits Ac4 and Ac1 obtained by decoding the burst address signal complying with the change rule of the linear mode from the start address.

Figure 15:
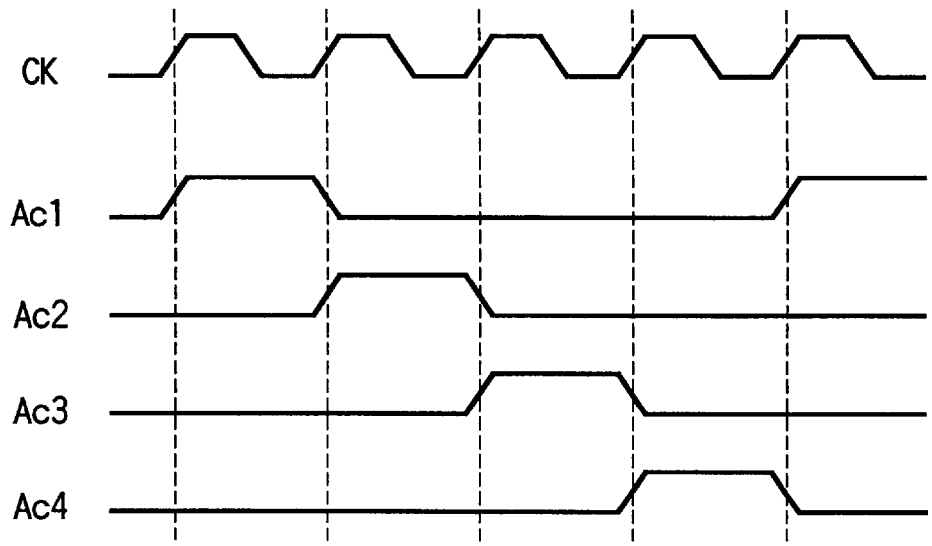
FIG. 15 is a timing chart showing a data shift operation in the linear mode when the start address is, e.g., (0, 0) in the circuit shown in FIG. 14.

The data shift operation in the linear mode when the address signal bits at the start are A1=0 and A0=0 will be described with reference to FIG. 15.

When A1=0 and A0=0 at the start, the outputs from the first to third decoder circuits 311 to 313 are at 0, and the output from the fourth decoder circuit 314 is at 1, so the four output signal bits Ac4 to Ac1 from the four register circuits 331 to 334 are preset to be (0001).

In the next cycle, the four output signal bits Ac4 to Ac1 are shifted to the left to be (0010) and then change to (0100)→(1000). Consequently, the count-up operation in the linear mode is performed.

With the same operation as described above, when the address signal bits A1=0 and A0=1 at the start, of the first to fourth decoder circuits 311 to 314, only the third decoder circuit 313 outputs a signal bit at 1, so the four output signal bits Ac4 to Ac1 are preset to be (0010) and change to (0100)→(1000)→(0001).

When the address signal bits A1=1 and A0=0 at the start, of the first to fourth decoder circuits 311 to 314, only the second decoder circuit 312 outputs a signal bits at 1, so the four output signal bits Ac4 to Ac1 are preset to be (0100) and change to (1000)→(0001)→(0010).

When the address signal bits A1=1 and A0=1 at the start, of the first to fourth decoder circuits 311 to 314, only the first decoder circuit 311 outputs a signal bits at 1, so the four output signal bits Ac4 to Ac1 are preset to be (1000) and change to (0001)→(0010)→(0100).

That is, as shown in FIG. 1, an operation is realized in which when the start address (A1, A0)=(0, 0), the burst address changes in the order of (0, 0)→(0, 1)→(1, 0)→(1, 1), when the start address is (0, 1), the burst address changes in the order of (0, 1)→(1, 0)→(1, 1)→(0, 0), when the start address is (1, 0), the burst address changes in the order of (1, 0)→(1, 1)→(0, 0)→(0, 1), and when the start address is (1, 1), the burst address changes in the order of (1, 1)→(0, 0)→(0, 1)→(1, 0).

In the interleave mode, in the first cycle at the start of the operation, the start address is received in synchronism with the rise of the clock signal CK and preset in the four register circuits 331 to 334. In the subsequent cycles, a data shift operation is performed along the second interconnection 352 forming a loop in the direction opposite to that in the linear mode or along the first interconnection 351 forming a loop in the same direction as in the linear mode in synchronism with the rise of the clock signal CK. The four register circuits 331 to 334 output the four output signal bits Ac4 and Ac1 obtained by decoding the burst address signal complying with the change rule of the interleave mode from the start address.

Figure 16:
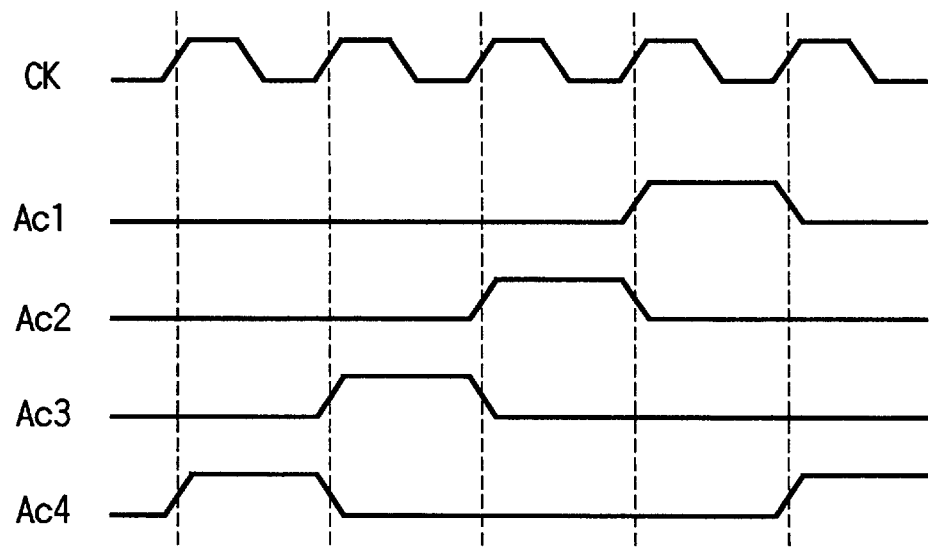
FIG. 16 is a timing chart showing a data shift operation in the interleave mode when the start address is, e.g., (1, 1) in the circuit shown in FIG. 14.

The data shift operation in the interleave mode when the address signal bits at the start are A1=1 and A0=1 will be described with reference to FIG. 16.

When A1=1 and A0=1 at the start, of the first to fourth decoder circuits 311 to 314, only the first decoder circuit 311 outputs a signal bit at 1, so the four output signal bits Ac4 to Ac1 from the four register circuits 331 to 334 are preset to be (1000).

In the subsequent cycles, the four multiplexer circuits 321 to 324 are switched to select the signals from the second input terminals (in2) or the third input terminals (in3) in accordance with the logic level of the signal bit A0 at the start. That is, when A0=0, the signals from the second input terminals (in2) are selected, and when A0=1, the signals from the third input terminals (in3) are selected.

In this case, since A0=1, the signals from the third input terminals (in3) are selected, and the data shift operation is performed along the second interconnection 352 forming a loop in the direction opposite to that in the linear mode is performed. In the next cycle, the four output signal bits Ac4 to Ac1 are shifted to the right to be (0100) and then change to (0010)→(0001). As a result, the count-up operation in the interleave mode is performed.

When the address signal bits A1=0 and A0=1 at the start, of the first to fourth decoder circuits 311 to 314, only the third decoder circuit 313 outputs a signal bit at 1, so the four output signal bits Ac4 to Ac1 are preset to be (0010) and shifted to (0001)→(1000)→(0100) because the data shift operation is performed along the loop in the direction opposite to that in the linear mode.

When the address signal bits A1=1 and A0=0 at the start, of the first to fourth decoder circuits 311 to 314, only the second decoder circuit 312 outputs a signal bit at 1, so the four output signal bits Ac4 to Ac1 are preset to be (0100). In this case, since A0=0, the four multiplexer circuits 321 to 324 select the signals from the second input terminals (in2). Since the data shift operation is performed along the first interconnection 351 forming a loop in the same direction as in the linear mode, the four output signal bits Ac4 to Ac1 are shifted to the left and change to (1000)→(0001)→(0010).

When the address signal bits A1=0 and A0=0 at the start, of the first to fourth decoder circuits 311 to 314, only the fourth decoder circuit 314 outputs a signal bit at 1, so the four output signal bits Ac4 to Ac1 are preset to be (0001). Since the data shift operation is performed along the first interconnection 351 forming a loop in the same direction as in the linear mode, the four output signal bits Ac4 to Ac1 change to (0010)→(0100)→(1000).

That is, as shown in FIG. 2, an operation is realized in which when the start address is (0, 0), the burst address changes in the order of (0, 0)→(0, 1)→(1, 0)→(1, 1), when the start address is (0, 1), the burst address changes in the order of (0, 1)→(1, 0)→(1, 1)→(0, 0), when the start address is (1, 0), the burst address changes in the order of (1, 0)→(1, 1)→(0, 0)→(0, 1), and when the start address is (1, 1), the burst address changes in the order of (1, 1)→(0, 0)→(0, 1)→(1, 0).

As is apparent from the above-described operation, the burst address counter shown in FIG. 14 can selectively cope with the linear mode or interleave mode of SDR scheme by using a simple arrangement for switching the first interconnection 351 and the second interconnection 352.

Figure 17:
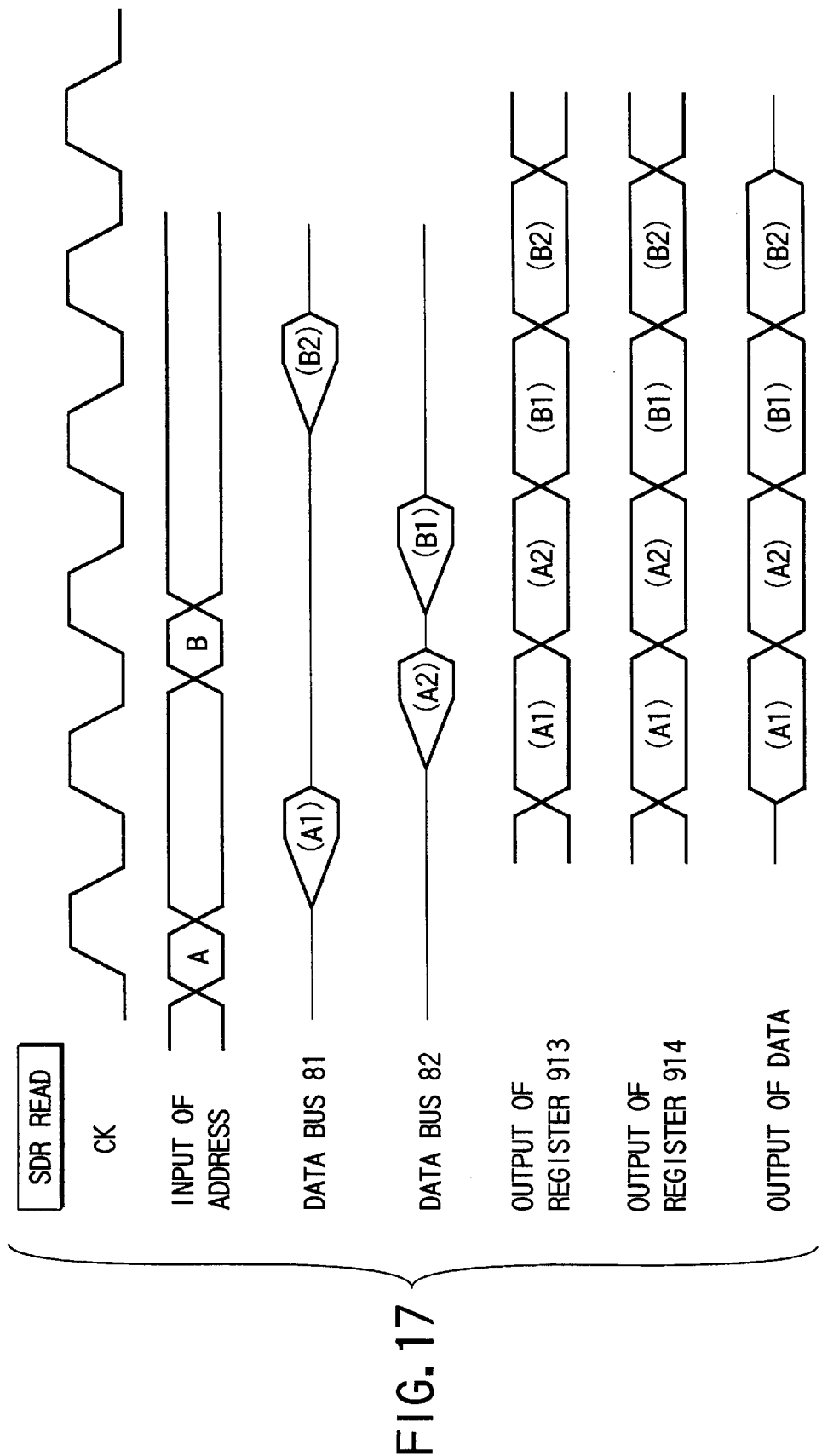
FIG. 17 is a timing chart showing a data read operation in the SDR operation mode when the synchronous SRAM shown in FIG. 7 uses the burst address counter shown in FIG. 14.

FIG. 17 shows the timing of data read operation in the SDR operation mode when the synchronous SRAM shown in FIG. 7 uses the burst address counter shown in FIG. 14 as the burst address counter 2. FIG. 17 shows a state wherein two addresses A and B are sequentially received in synchronism with the rise of the clock signal CK.

The address A is an address when the lower address signal bit Y0 of the burst address signal is at "0". In the memory chip, burst address bits A1 and A2 are continuously generated by the burst address counter 2 in correspondence with the address A. In this case, since the lower address signal bit Y0 starts from "0", the lower address signal bit Y0 changes from 0 to 1 in correspondence with the burst address bits A1 and A2.

For the burst address bit A1, a memory cell from which data is read out to the first data bus 81 if selected. For the burst address bit A2, a memory cell from which data is read out to the second data bus 82 is selected.

The address B is an address when the lower address signal bit Y0 of the burst address signal is at "1". In the memory chip, burst address bits B1 and B2 are continuously generated by the burst address counter 2 in correspondence with the address B. In this case, since the lower address signal bit Y0 starts from "1", the lower address signal bit Y0 changes from 1 to 0 in correspondence with the burst address bits B1 and B2.

For the burst address bit B1, a memory cell from which data is read out to the second data bus 82 is selected. For the burst address bit B2, a memory cell from which data is read out to the first data bus 81 is selected.

The data read operation of the synchronous SRAM shown in FIG. 7 in the SDR operation mode will be described with reference to FIG. 17.

First, an address signal corresponding to address A is received in synchronism with the rise of the clock signal CK.

The data (A1) of a memory cell at the burst address A1 is read out to the first data bus 81 in synchronism with the fall of the clock signal CK. The data (A1) read out to the first data bus 81 is also transferred to the second data bus 82 by the first data bus control circuit 21, input to the two data line sense amplifiers 911 and 912 through the two data buses 81 and 82, respectively, and amplified.

In the next cycle, the output data (A1) from the two data line sense amplifiers 911 and 912 are received by the first output register 913 and second output register 914 in synchronism with the rise of the clock signal CK. The received data (A1) are output to the output buffer 917 through the data line transfer gates 915 and 916 in correspondence with the "H" level and "L" level periods of the clock signal CK, respectively, amplified, and output from the chip.

Subsequently, data (A2) of a memory cell at the burst address A2 is read out to the second data bus 82 in synchronism with the fall of the clock signal CK. The data (A2) read out to the second data bus 82 is also transferred to the first data bus 81 by the second data bus control circuit 22, input to the two data line sense amplifiers 911 and 912 through the two data buses 81 and 82, respectively, and amplified.

In the next cycle, an address signal corresponding to address B is received in synchronism with the rise of the clock signal CK, and simultaneously, the output data (A2) from the two data line sense amplifiers 911 and 912 are received by the first output register 913 and second output register 914. The received data (A2) are output to the output buffer 917 through the data line transfer gates 915 and 916 in correspondence with the "H" level and "L" level periods of the clock signal CK, respectively, amplified, and output from the chip.

Subsequently, data (B1) of a memory cell at the burst address B1 is read out to the second data bus 82 in synchronism with the fall of the clock signal CK. The data (B1) read out to the second data bus 82 is also transferred to the first data bus 81 by the second data bus control circuit 22, input to the two data line sense amplifiers 911 and 912 through the two data buses 81 and 82, respectively, and amplified.

In the next cycle, the output data (B1) from the two data line sense amplifiers 911 and 912 are received by the first output register 913 and second output register 914 in synchronism with the rise of the clock signal CK. The received data (B1) are output to the output buffer 917 through the data line transfer gates 915 and 916 in correspondence with the "H" level and "L" level periods of the clock signal CK, respectively, amplified, and output from the chip.

Subsequently, data (B2) of a memory cell at the burst address B2 is read out to the first data bus 81 in synchronism with the fall of the clock signal CK. The data (B2) read out to the first data bus 81 is also transferred to the second data bus 82 by the first data bus control circuit 21, input to the two data line sense amplifiers 911 and 912 through the two data buses 81 and 82, respectively, and amplified.

In the next cycle, the output data (B2) from the two data line sense amplifiers 911 and 912 are received by the first output register 913 and second output register 914 in synchronism with the rise of the clock signal CK. The received data (B2) are output to the output buffer 917 through the data line transfer gates 915 and 916 in correspondence with the "H" level and "L" level periods of the clock signal CK, respectively, amplified, and output from the chip.

<Second Embodiment>

Figure 18:
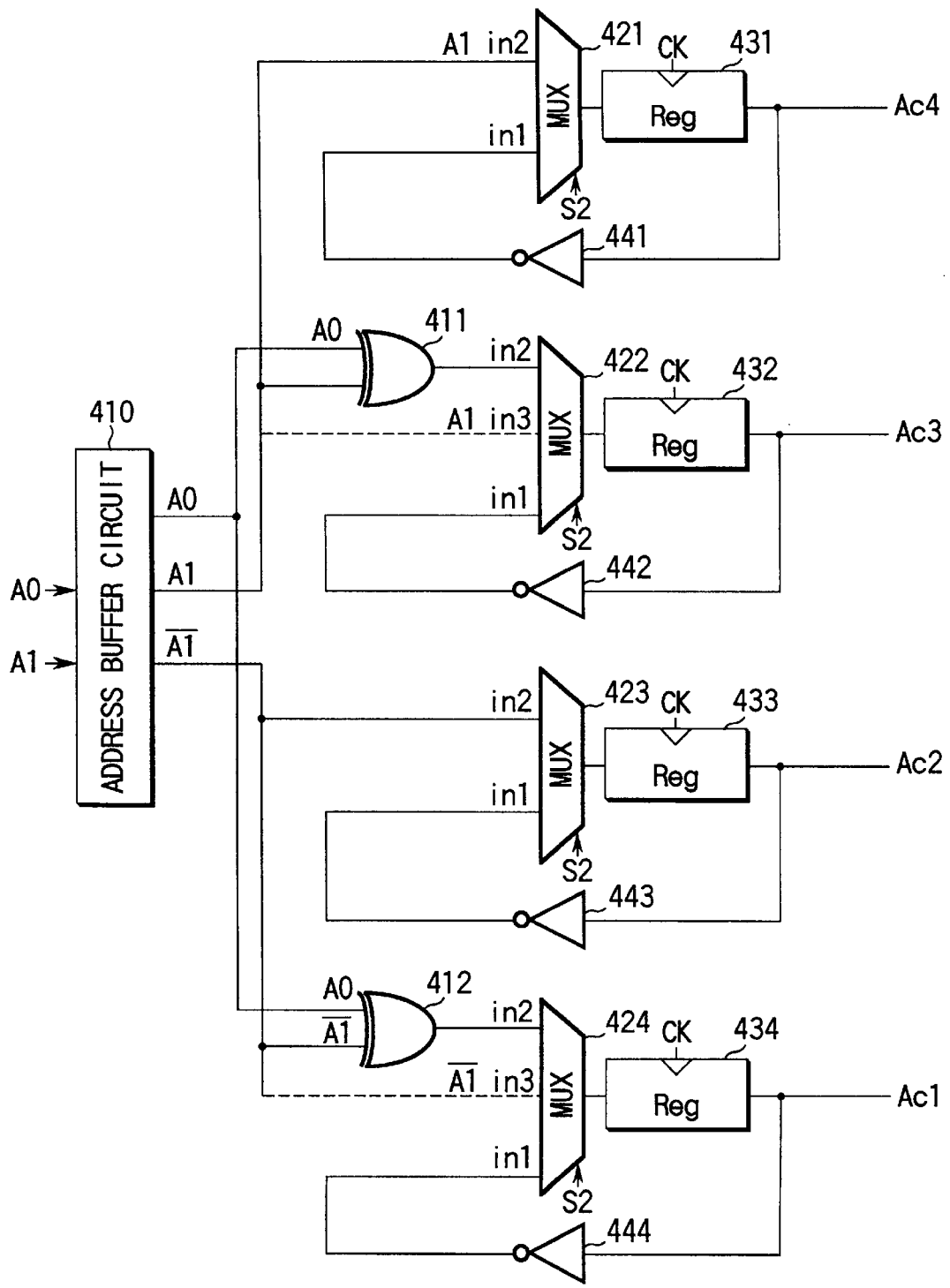
FIG. 18 is a circuit diagram showing a case in which the burst address counter shown in FIG. 7 generates a burst address signal in the linear or interleave mode of DDR scheme.

FIG. 18 is a circuit diagram showing an example in which the burst address counter 2 shown in FIG. 7 can selectively cope with the linear or interleave mode of DDR scheme.

Referring to FIG. 18, signals A0 and A1 are internal address signals generated by inputting two lower signal bits of an external address signal to an address buffer circuit 410, and a signal $\overline{A1}$ is an inverted signal of the internal address signal A1. Reference symbol CK denotes an internal clock signal supplied outside the memory chip through a buffer circuit (not shown).

Reference numerals 411 and 412 denote first and second two-input decoder circuits (e.g., exclusive OR circuits). The first decoder circuit 411 receives the signals A0 and A1. The second decoder circuit 412 receives the signals $\overline{A0}$ and $\overline{A1}$.

Reference numerals 421 and 423 denote first and third two-input multiplexer (MUX) circuits; and 422 and 424, second and fourth three-input multiplexer circuits.

Reference numerals 431 to 434 denote first to fourth register (Reg) circuits for receiving the clock signal CK and receiving input signals in synchronism with the clock signal CK. The output signals from the first to fourth multiplexer circuits 421 to 424 are input to the first to fourth register circuits 431 to 434, respectively.

Reference numerals 441 to 444 denote inverter circuits forming looped interconnections for inverting the output signals from the first to fourth register circuits 431 to 434 and inputting the inverted signals to the first input terminals (in1) of the first to fourth multiplexer circuits 421 to 424, respectively.

The signal A1 is input to the second input terminal (in2) of the first multiplexer circuit 421. The inverted signal $\overline{A1}$ is input to the second input terminal (in2) of the third multiplexer circuit 423.

The output signal from the first decoder circuit 411 is input to the second input terminal (in2) of the second multiplexer circuit 422. The output signal from the second decoder circuit 412 is input to the second input terminal (in2) of the fourth multiplexer circuit 424.

The signal A1 is input to the third input terminal (in3) of the second multiplexer circuit 422. The inverted signal $\overline{A1}$ is input to the third input terminal (in3) of the fourth multiplexer circuit 424.

A multiplexer control signal S2 is input to the control input terminals of the first to fourth multiplexer circuits 421 to 424, so the inputs to the first input terminals, the inputs to the second input terminals, or the inputs to the third input terminals are selectively output.

In the DDR operation mode, two consecutive addresses must be simultaneously selected by four output signal bits Ac4 to Ac1 output from the four register circuits 431 to 434. At the start of operation of the burst address counter, each of the first to fourth multiplexer circuits 421 to 424 receives a start address for simultaneously setting two bits of the four output signal bits Ac4 to Ac1 in the selected state ("1") from the second input terminal (in2) or third input terminal (in3). In the subsequent cycles, the two remaining bits of the four signal bits Ac4 to Ac1, other than the two bits selected in the current cycle, are selected in the next cycle. Each of the first to fourth multiplexer circuits 421 to 424 is controlled to receive the output from a corresponding one of the inverter circuits 441 to 444, which is the inverted signal of the output from a corresponding one of the register circuits 431 to 434 from the first input terminal (in1). Hence, an operation of toggling the outputs from the register circuits 431 to 434 in synchronism with the rise of the clock signal CK is performed.

More specifically, in the first cycle at the start of the burst address generation operation, the start address is received in synchronism with the rise of the clock signal CK and preset in the four register circuits 431 to 434. In the subsequent cycles, the outputs from the register circuits 431 to 434 are toggled in synchronism with the rise of the clock signal CK.

With this operation, the four register circuits 431 to 434 output the four signal bits Ac4 to Ac1 obtained by decoding the burst address signal complying with the change rule of the linear or interleave mode from the start address.

When the start address is to be received in the linear mode, the first to fourth multiplexer circuits 421 to 424 are controlled to receive the signals from the second input terminals (in2).

In the interleave mode, the first multiplexer circuit 421 receives the signal from the second input terminal (in2), the second multiplexer circuit 422 receives the signal from the third input terminal (in3), the third multiplexer circuit 423 receives the signal from the second input terminal (in2), and the fourth multiplexer circuit 424 receives the signal from the third input terminal (in3).

In the interleave mode, A0=0 may be fixed by an input buffer section (not shown). In this case, the outputs from the first and second decoder circuits (exclusive OR circuits) 411 and 412 are A1 and $\overline{A1}$, respectively, so the first to fourth multiplexer circuits 421 to 424 are controlled to receive the signals from the second input terminals (in2), as in the linear mode. In this case, the three-input multiplexer circuits 422 and 424 need not have the third input terminals (in3). Since two-input multiplexer circuits like the multiplexer circuits 421 and 423 can be used, the circuit arrangement can be further simplified.

As is apparent from the above-described operation, the burst address counter shown in FIG. 18 can selectively cope with the linear mode or interleave mode of DDR scheme by using a simple arrangement for switching to toggle the outputs from the register circuits 431 to 434 after reception of the start address.

Figure 19:
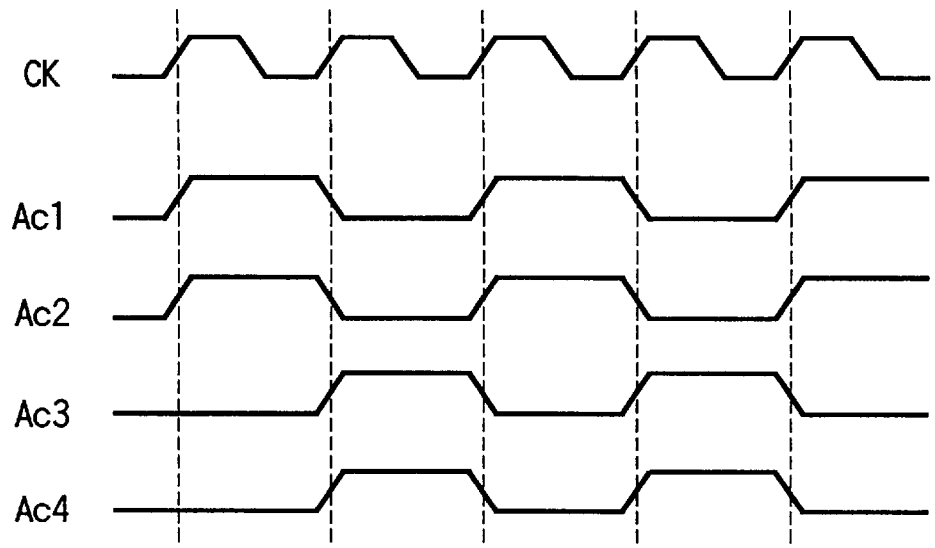
FIG. 19 is a timing chart showing the data shift operation in the linear mode when the start address is (0, 0) in the circuit shown in FIG. 18.

The data shift operation in the linear mode when the address signal bits at the start are A1=0 and A0=0 will be described with reference to FIG. 19.

When the address signal bits A1=0 and A0=0 at the start, the output from the first decoder circuit 411 is at 0, and the output from the second decoder circuit 412 is at 1, so the four output signal bits Ac4 to Ac1 from the four register circuits 431 to 434 are preset to be (0011).

In the next cycle, the four output signal bits Ac4 to Ac1 are toggled to (1100), and subsequently, to (0011)→(1100). As a result, a burst address signal in the linear mode is output, as shown in FIG. 3.

When the address signal bits A1=0 and A0=1 or A1=1 and A0=0 at the start, a burst address signal in the linear mode is output by the same operation as described above, as shown in FIG. 3.

Figure 20:
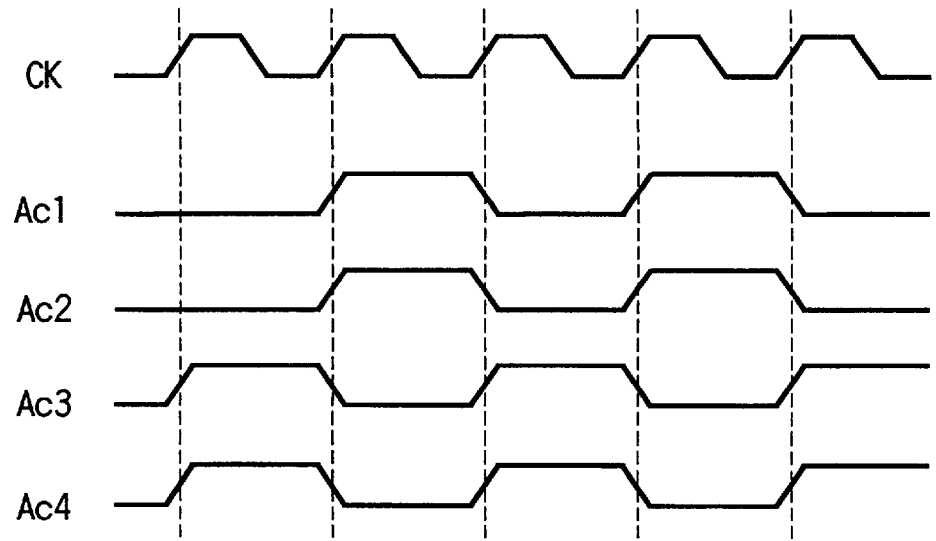
FIG. 20 is a timing chart showing the data shift operation in the interleave mode when the start address is (1, 1) in the circuit shown in FIG. 18.

The data shift operation in the interleave mode when the address signal bits at the start are A1=1 and A0=1 will be described with reference to FIG. 20.

When the start address in the interleave mode is to be received, the first and third multiplexer circuits 421 and 423 receive the signals from the second input terminals (in2), and the second and fourth multiplexer circuits 422 and 424 receive the signals from the third input terminals (in3). Hence, when the address signal bits A1=1 and A0=0 at the start, the four output signal bits Ac4 to Ac1 from the four register circuits 431 to 434 are preset to be (1100).

In the next cycle, the four output signal bits Ac4 to Ac1 are toggled to (0011), and subsequently, to (1100)→(0011). As a result, a burst address signal in the interleave mode is output, as shown in FIG. 4.

When the address signal bits A1=1 and A0=0 or A1=0 and A0=1 at the start, a burst address signal in the interleave mode is output by the same operation as described above, as shown in FIG. 4.

Figure 21:
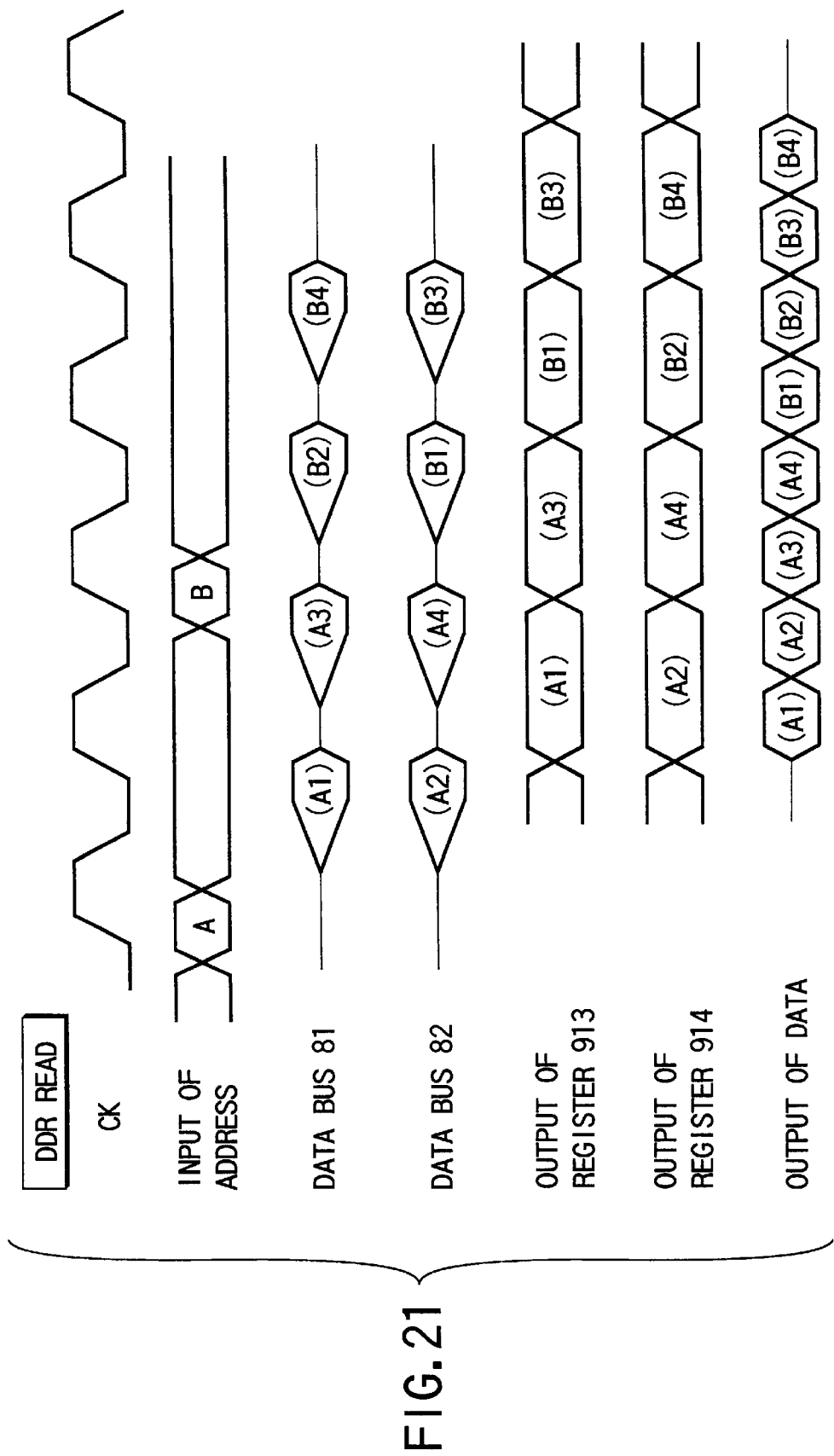
FIG. 21 is a timing chart showing a data read operation in the DDR operation mode when the synchronous SRAM shown in FIG. 7 uses the burst address counter shown in FIG. 18.

FIG. 21 shows the timing of data read operation in the DDR operation mode when the synchronous SRAM shown in FIG. 7 uses the burst address counter shown in FIG. 18 as the burst address counter 2. FIG. 21 shows a state wherein two addresses A and B are sequentially received in synchronism with the rise of the clock signal CK.

The address A is an address when the lower address signal bit Y0 of the burst address signal is at "0". In the memory chip, burst address bits A1, A2, A3, and A4 are continuously generated by the burst address counter 2 in correspondence with the address A. In this case, since the lower address signal bit Y0 starts from "0", the lower address signal bit Y0 changes in the order of 0→1→0→1 in correspondence with the burst address bits A1, A2, A3, and A4.

The address B is an address when the lower address signal bit Y0 of the burst address signal is at "1". In the memory chip, burst address bits B1, B2, B3, and B4 are continuously generated by the burst address counter 2 in correspondence with the address B. In this case, since the lower address signal bit Y0 starts from "1", the lower address signal bit Y0 changes in the order of 1→0→1→0 in correspondence with the burst address bits B1, B2, B3, and B4.

For the burst address bit A1 or A3, a memory cell from which data is read out to a first data bus 81 is selected. For the burst address bit A2 or A4, a memory cell from which data is read out to a second data bus 82 is selected.

For the burst address bit B1 or B3, a memory cell from which data is read out to the second data bus 82 is selected. For the burst address bit B2 or B4, a memory cell from which data is read out to the first data bus 81 is selected.

The data read operation of the synchronous SRAM shown in FIG. 7 in the SDR operation mode will be described with reference to FIG. 21.

First, an address signal corresponding to address A is received in synchronism with the rise of the clock signal CK.

Subsequently, data (A1 and A2) of memory cells corresponding to the two burst addresses A1 and A2 are simultaneously read out to the two data buses 81 and 82 in synchronism with the fall of the clock signal CK. In this case, the data (A1) corresponding to the burst address A1 is read out to the first data bus 81, and the data (A2) corresponding to the burst address A2 is read out to the second data bus 82.

The data (A1 and A2) corresponding to the two addresses, which are read out to the different data buses (first data bus 81 and second data bus 82) are input to two data line sense amplifiers 911 and 912, respectively, through a first data bus control circuit 21 controlled not to switch the transfer buses, and are amplified.

In the next cycle, the output data (A1 and A2) from the two data line sense amplifiers 911 and 912 are received by a first output register 913 and a second output register 914, respectively, in synchronism with the rise of the clock signal CK. The received data (A1 and A2) corresponding to the two addresses are output to an output buffer circuit 917 through data line transfer gate 915 and 916 in correspondence with the "H" level and "L" level periods of the clock signal CK, respectively, amplified, and output from the chip.

Subsequently, data (A3 and A4) of memory cells corresponding to the two burst addresses A3 and A4 are simultaneously read out to the two data buses in synchronism with the fall of the clock signal CK. In this case, the data (A3) corresponding to the burst address A3 is read out to the first data bus 81, and the data (A4) corresponding to the burst address A4 is read out to the second data bus 82. The readout data (A3 and A4) are input to the two data line sense amplifiers 911 and 912, respectively, through the first data bus control circuit 21 controlled not to switch the transfer buses, and amplified.

In the next cycle, an address signal corresponding to address B is received in synchronism with the rise of the clock signal CK, and simultaneously, the output data (A3 and A4) from the two data line sense amplifiers 911 and 912 are received by the first output register 913 and second output register 914, respectively. The received data (A3 and A4) corresponding to the two addresses are output to the output buffer circuit 917 through the data line transfer gate 915 and 916 in correspondence with the "H" level and "L" level periods of the clock signal CK, respectively, amplified, and output from the chip.

Subsequently, data (B1 and B2) of memory cells corresponding to the two burst addresses B1 and B2 are simultaneously read out to the two data buses in synchronism with the fall of the clock signal CK. In this case, the data (B1) corresponding to the burst address B1 is read out to the second data bus 82, and the data (B2) corresponding to the burst address B2 is read out to the first data bus 81. The readout data (B2 and B1) are input to the two data line sense amplifiers 911 and 912, respectively, through the first data bus control circuit 21 controlled to switch the transfer buses, as shown in FIG. 10B, and amplified.

In the next cycle, the output data (B1 and B2) from the two data line sense amplifiers 911 and 912 are received by the first output register 913 and second output register 914, respectively, in synchronism with the rise of the clock signal CK. The received data (B1 and B2) corresponding to the two addresses are output to the output buffer circuit 917 through the data line transfer gate 915 and 916 in correspondence with the "H" level and "L" level periods of the clock signal CK, respectively, amplified, and output from the chip.

Subsequently, data (B3 and B4) of memory cells corresponding to the two burst addresses B3 and B4 are simultaneously read out to the two data buses in synchronism with the fall of the clock signal CK. In this case, the data (B3) corresponding to the burst address B3 is read out to the second data bus 82, and the data (B4) corresponding to the burst address B4 is read out to the first data bus 81. The readout data (B4 and B3) are input to the two data line sense amplifiers 911 and 912, respectively, through the first data bus control circuit 21 controlled to switch the transfer buses, and amplified.

In the next cycle, the output data (B3 and B4) from the two data line sense amplifiers 911 and 912 are received by the first output register 913 and second output register 914, respectively, in synchronism with the rise of the clock signal CK. The received data (B3 and B4) corresponding to the two addresses are output to the output buffer circuit 917 through the data line transfer gate 915 and 916 in correspondence with the "H" level and "L" level periods of the clock signal CK, respectively, amplified, and output from the chip.

<Third Embodiment>

Figure 22:
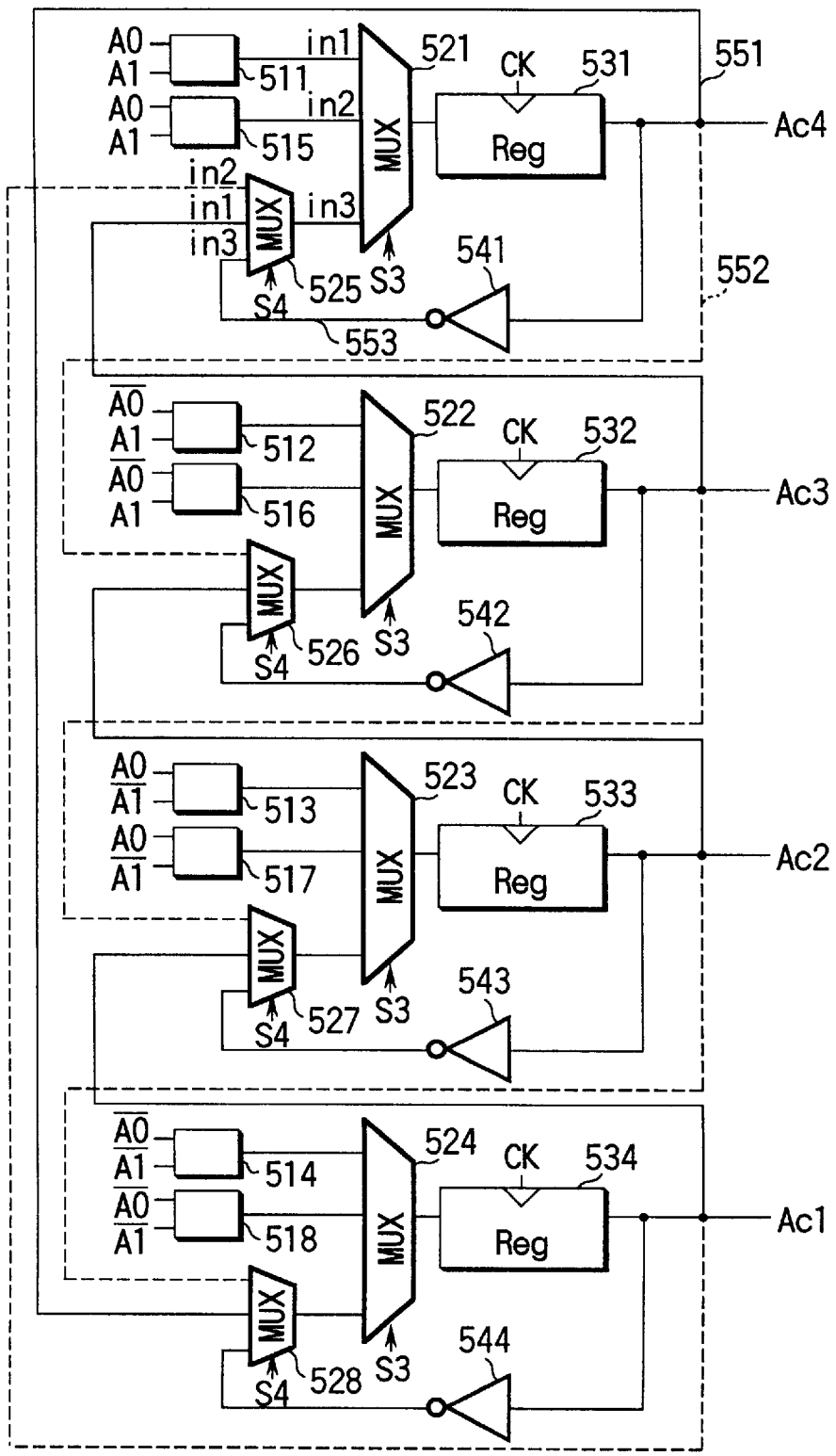
FIG. 22 is a circuit diagram showing a case in which a burst address signal in the linear or interleave mode of SDR or DDR scheme is selectively generated by the burst address counter shown in FIG. 7.

FIG. 22 is a circuit diagram showing an example in which the burst address counter 2 shown in FIG. 7 can selectively cope with the linear or interleave mode of SDR or DDR scheme.

Referring to FIG. 22, reference symbols A0 and A1 denote internal address signals generated by inputting two lower signal bits of an external address signal to an address buffer circuit (not shown); $\overline{A0}$ and $\overline{A1}$, inverted signals of the internal address signals A0 and A1; and CK, an internal clock signal supplied outside the memory chip through a buffer circuit (not shown).

First to fourth decoder circuits 511 to 514 forming a first group are two-input decoder circuits used in the SDR operation mode. The first decoder circuit 511 receives the signals A0 and A1. The second decoder circuit 512 receives the signals $\overline{A0}$ and A1. The third decoder circuit 513 receives the signals A0 and $\overline{A1}$. The fourth decoder circuit 514 receives the signals $\overline{A0}$ and $\overline{A1}$.

Fifth to eighth decoder circuits 515 to 518 forming a second group are two-input decoder circuits (the arrangement is different from the decoder circuit of the first group) used in the DDR operation mode. The fifth decoder circuit 515 receives the signals A0 and A1. The sixth decoder circuit 516 receives the signals $\overline{A0}$ and A1. The seventh decoder circuit 517 receives the signals A0 and $\overline{A1}$. The eighth decoder circuit 518 receives the signals $\overline{A0}$ and $\overline{A1}$.

First to fourth multiplexer circuits 521 to 524 forming a first group are three-input multiplexer circuits. Multiplexer circuits 525 to 528 forming a second group are three-input multiplexer circuits.

Reference numerals 531 to 534 denote first to fourth register circuits for receiving the clock signal CK and receiving input signals in synchronism with the clock signal CK. The register circuits 531 to 534 receive the output signals from the first to fourth multiplexer circuits 521 to 524, respectively.

Reference numerals 541 to 544 denote first to fourth inverter circuits for inverting the output signals from the first to fourth register circuits 531 to 534, respectively.

A first interconnection 551 forms a loop for inputting the output signals from the first to fourth register circuits 531 to 534 to the first input terminals (in1) of the eighth multiplexer circuit 528 and fifth to seventh multiplexer circuits 525 to 527, respectively.

A second interconnection 552 forms a loop for inputting the output signals from the first to fourth register circuits 531 to 534 to the second input terminals (in2) of the sixth to eighth multiplexer circuits 526 to 528 and fifth multiplexer circuit 525, respectively.

A third interconnection 553 forms a loop for inputting the output signals from the first to fourth inverter circuits 541 to 544 to the third input terminals (in3) of the fifth to eighth multiplexer circuits 525 to 528, respectively.

The output signals from the first to fourth decoder circuits 511 to 514 are input to the first input terminals (in1) of the first to fourth multiplexer circuits 521 to 524, respectively. The output signals from the fifth to eighth decoder circuits 515 to 518 are input to the second input terminals (in2) of the first to fourth multiplexer circuits 521 to 524, respectively. The output signals from the fifth to eighth multiplexer circuits 525 to 528 are input to the third input terminals (in3) of the fifth to fourth multiplexer circuits 521 to 524, respectively.

That is, the burst address counter shown in FIG. 22 comprises four decoder circuits of a first group for decoding address signals, four decoder circuits of a second group for decoding address signals, four multiplexer circuits of a first group each of which has a plurality of input terminals to receive the output signal from a corresponding one of the four decoder circuit of the first group from the first input terminal, receive the output signal from a corresponding one of the four decoder circuits of the second group from the second input terminal, and selectively output the input to the plurality of input terminals on the basis of a multiplexer control signal supplied to a control input terminal, four multiplexer circuits of a second group each of which has a plurality of input terminals to input the output signal to the third input terminal of a corresponding one of the four multiplexer circuits of the first group, four register circuits for receiving the output signals from the four multiplexer circuits of the first group, respectively, receiving a clock signal, and receiving input signals in synchronism with the clock signal, a first interconnection used in the linear or interleave mode of single data rate scheme and connected to input the output signal from the first register circuit of the four register circuits to the first input terminal of the fourth multiplexer circuit of the fourth multiplexer circuits of the second group and input the output signals from the second to fourth register circuits of the four register circuits to the first input terminals of the first to third multiplexer circuits of the four multiplexer circuits of the second group, a second interconnection used in the interleave mode of single data rate scheme and connected to input the output signals from the first to third register circuits of the four register circuits to the second input terminals of the second to fourth multiplexer circuits of the four multiplexer circuits of the second group and input the output signal from the fourth register circuit of the four register circuits to the second input terminal of the first multiplexer circuit of the four multiplexer circuits of the second group, and a third interconnection used in the linear or interleave mode of double data rate scheme and connected to input the inverted signals of the output signals from the four register circuits to the third input terminals of the four multiplexer circuits of the second group, respectively.

A multiplexer control signal S3 is supplied to the control input terminals of the first to fourth multiplexer circuits 521 to 524 to selectively output the inputs to the first input terminals (in1), the inputs to the second input terminals (in2), or the inputs to the third input terminals (in3).

In the first cycle at the start of the operation of the burst address counter, the first to fourth multiplexer circuits 521 to 524 select the signals from the first input terminals (in1) or second input terminals (in2) to receive start addresses in synchronism with the rise of the clock signal CK and preset the start addresses in the four register circuits 531 to 534, respectively. In the subsequent cycles, the multiplexer circuits 521 to 524 are switched and controlled by the multiplexer control signal S3 to select the signals from the third input terminals (in3) (output signals from the fifth to eighth multiplexer circuits 525 to 528).

When the first to fourth multiplexer circuits 521 to 524 are to receive the start addresses, in the SDR operation mode, the signal from the first input terminal (in1) is selected. In the linear mode of DDR scheme, the signal from the second input terminal (in2) is selected, and in the interleave mode of DDR scheme, the signal from the first input terminal (in1) or second input terminal (in2) is selected.

From the second cycle at the start of the operation of the burst address counter, the fifth to eighth multiplexer circuits 525 to 528 are controlled by a multiplexer control signal S4 supplied to the control input terminals to selectively output the inputs to the first input terminals (in1), the inputs to the second input terminals (in2), or the inputs to the third input terminals (in3).

In the linear mode of SDR scheme, the fifth to eighth multiplexer circuits 525 to 528 select the signals from the first input terminals (in1).

The circuit shown in FIG. 22 performs a data shift operation along the first interconnection 551 forming a loop in a predetermined direction in synchronism with it the rise of the clock signal CK, so signal bits Ac4 to Ac1 obtained by decoding the burst address signal complying with the change rule of the linear mode from the start address are output from the four register circuits 531 to 534, respectively.

In the interleave mode of SDR scheme, the fifth to eighth multiplexer circuits 525 to 528 select the signals from the first input terminals (in1) or second input terminals (in2) in accordance with the lower signal bit A0 of the address signals A1 and A0 at the start.

The circuit shown in FIG. 22 performs a data shift operation along the first interconnection 551 forming a loop in a predetermined direction or along the second interconnection 552 forming a loop in the direction opposite to that in the linear mode in synchronism with the rise of the clock signal CK, so the signal bits Ac4 to Ac1 obtained by decoding the burst address signal complying with the change rule of the interleave mode from the start address are output from the four register circuits 531 to 534, respectively.

In the DDR operation mode, the fifth to eighth multiplexer circuits 525 to 528 select the signals from the third input terminals (in3) (output signals from the first to fourth inverter circuits 541 to 544). The circuit shown in FIG. 22 toggles the outputs from the register circuits 531 to 534 in synchronism with the rise of the clock signal CK, so the signal bits Ac4 to Ac1 obtained by decoding the burst address signal complying with the change rule of the linear or interleave mode of DDR scheme from the start address are output from the four register circuits 531 to 534, respectively.

As is apparent from the above-described operation, the burst address counter shown in FIG. 22 can selectively cope with the linear or interleave mode of SDR or DDR scheme by using a simple arrangement in which the first to fourth multiplexer circuits 521 to 524 select the pre-decoded output of the address signal and the outputs from the fifth to eighth multiplexer circuits 525 to 528, and the fifth to eighth multiplexer circuits 525 to 528 selectively switch and use the first interconnection 551 or second interconnection 552 in the SDR operation mode, or uses the third interconnection 553 in the DDR operation mode.

More specifically, in the burst address counter shown in FIG. 22, when a burst address in the linear mode of single data rate scheme is to be generated, the four multiplexer circuits of the first group and the four multiplexer circuits of the second group are controlled such that the four multiplexer circuits of the first group select the signals from the first input terminals at the start of the burst address generation operation, and then, the four multiplexer circuits of the second group select the signals from the first input terminals. When a burst address in the interleave mode of single data rate scheme is to be generated, control is performed such that the four multiplexer circuits of the first group select the signals from the second input terminals at the start of the burst address generation operation, and then, the four multiplexer circuits of the second group select the signals from the first or second input terminals in accordance with the logic level of the start address. When a burst address in the linear mode of double data rate scheme is to be generated, control is performed such that the four multiplexer circuits of the first group select the signals from the first input terminals at the start of the burst address generation operation, and then, the four multiplexer circuits of the second group select the signals from the third input terminals. When a burst address in the interleave mode of double data rate scheme is to be generated, control is performed such that the four multiplexer circuits of the first group select the signals from the second input terminals at the start of the burst address generation operation, and then, the four multiplexer circuits of the second group select the signals from the third input terminals.

In each of the above embodiments, the number m of registers (and the number of associated circuits) is 4. Generally, m=2n (n is an integer; n≧2).

FIG. 7 shows an SRAM capable of selectively designating the DDR or SDR operation mode. However, the present invention can be applied to a memory having one of the SDR and DDR operation modes.

As has been described above, according to the present invention, multiplexers are arranged on the input sides of a plurality of registers, and the address is incremented by selecting the connection relationship between the registers. With this arrangement, a semiconductor memory device capable of selectively generating the linear or interleave mode of SDR scheme and having a simple circuit arrangement, as compared to an arrangement using a T F/F circuit in each counter, and excellent high-speed operability, and a burst address counter therefor can be provided.

In addition, according to the present invention, multiplexers are arranged on the input sides of a plurality of registers, and signals obtained by inverting the outputs from the registers are selected by the multiplexers. With this arrangement, a synchronous semiconductor memory device capable of selectively generating a burst address signal in the linear or interleave mode of DDR scheme, realized by a relatively simple circuit arrangement, as compared to an arrangement using a T F/F circuit in each counter, and capable of achieving a higher memory operation speed, and a burst address counter therefor can be provided.

Furthermore, according to the present invention, multiplexers are arranged on the input sides of a plurality of registers, and the address is incremented by selecting the connection relationship between the registers, or signals obtained by inverting the outputs from the registers are selected by the multiplexers. With this arrangement, a synchronous semiconductor memory device capable of selectively generating a burst address signal in the linear or interleave mode to selectively cope with the SDR or DDR operation mode, realized by a relatively simple circuit arrangement, as compared to an arrangement using a T F/F circuit in each counter, and capable of achieving a higher memory operation speed, and a burst address counter therefor can be provided.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. A burst address counter comprising:
    first to fourth decoder circuits for decoding address signals;
    first to fourth multiplexer circuits having first to third input terminals to receive the decoded address signals output from said first to fourth decoder circuits at the first input terminals, respectively, and selectively output one of input signals input to the first to third input terminals on the basis of a control signal;
    first to fourth register circuits for storing output signals representing a burst address and output from said first to fourth multiplexer circuits, respectively;
    a first interconnection used in linear and interleave modes of single data rate scheme and connected to input the output signal stored in said first register circuit to the second input terminal of said fourth multiplexer circuit and the output signals stored in said second to fourth register circuits to the second input terminals of said first to third multiplexer circuits, respectively; and
    a second interconnection used in the interleave mode of single data rate scheme and connected to input the output signals stored in said first to third register circuits to the third input terminals of said second to fourth multiplexer circuits, respectively, and the output signal stored in said fourth register circuit to the third input terminal of said first multiplexer circuit.

2. A counter according to claim 1,
    wherein when a burst address in the linear mode of single data rate scheme is to be generated, each of said first to fourth multiplexer circuits is controlled to select the input signal to the first input terminal at the start of the burst address generation operation and then select the input signal to the second input terminal, and when a burst address in the interleave mode of single data rate scheme is to be generated, each of said first to fourth multiplexer circuits is controlled to select the input signal to the first input terminal at the start of the burst address generation operation and then select one of the input signal to the second input terminal and the input signal to the third input terminal in accordance with a logic level of a lower bit of a start address.

3. A counter according to claim 1,
    wherein the output signals are stored in said first to fourth register circuits on the basis of a clock signal.

4. A semiconductor memory device including the burst address counter according to claim 1, comprising:
    a memory cell array in which a plurality of memory cells are arrayed in a matrix;
    a plurality of data buses through which data to be read/written from/in the memory cells propagate;
    a read/write control circuit for controlling a data read/write from/in memory cells in said memory cell array, which correspond to two consecutive addresses, and parallelly processing the data between said read/write control circuit and said plurality of data buses;
    a memory cell selection circuit for selecting the memory cells in said memory cell array in accordance with the address signal containing the output signals representing a burst address output from said burst address counter;
    a column transfer gate group controlled by said memory cell selection circuit to select a column in said memory cell array;
    a first data line for outputting data read out from a plurality of memory cells selected when a predetermined column address signal bit of the address signal is at "0" through said column transfer gate group;
    a second data line for outputting data read out from a plurality of memory cells selected when the predetermined column address signal bit is at "1" through said column transfer gate group;
    a first sense amplifier for amplifying the data read out from the memory cells and a first data write circuit for writing data in the memory cells, said first sense amplifier and said first data write circuit being connected to said first data line and having an active period controlled by a column address signal bit other than the predetermined column address signal bit;
    a second sense amplifier for amplifying the data read out from the memory cells and a second data write circuit for writing data in the memory cells, said second sense amplifier and said second data write circuit being connected to said second data line and having an active period controlled by the column address signal bit other than the predetermined column address signal bit;

a first data bus commonly connected to a plurality of sets of first sense amplifiers and first data write circuits having different active periods; and a second data bus commonly connected to a plurality of sets of second sense amplifiers and second data write circuits having different active periods.

5. A semiconductor memory device according to claim 4, wherein the memory cell comprises a static memory cell.

6. A semiconductor memory device comprising:

a memory cell array;

a burst address counter for generating a burst address signal as part of a column address signal for designating a column address of said memory cell array on the basis of external address signals; and a circuit for selecting a memory cell in said memory cell array on the basis of the address signals and the burst address signal output from said burst address counter, wherein said burst address counter comprises:

first to fourth decoder circuits for decoding the address signals;

first to fourth multiplexer circuits having first to third input terminals to receive the decoded address signals output from said first to fourth decoder circuits at the first input terminals, respectively, and selectively output one of input signals input to the first to third input terminals on the basis of a control signal;

first to fourth register circuits for storing output signals representing a burst address and output from said first to fourth multiplexer circuits, respectively;

a first interconnection used in linear and interleave modes of single data rate scheme and connected to input the output signal stored in said first register circuit to the second input terminal of said fourth multiplexer circuit and the output signals stored in said second to fourth register circuits to the second input terminals of said first to third multiplexer circuits, respectively; and a second interconnection used in the interleave mode of single data rate scheme and connected to input the output signals stored in said first to third register circuits to the third input terminals of said second to fourth multiplexer circuits, respectively, and the output signal stored in said fourth register circuit to the third input terminal of said first multiplexer circuit.

7. A burst address counter comprising:

first multiplexer circuits each having first and second input terminals to receive an address signal at the second input terminal, select one of input signals input to the first and second input terminals, and output a first output signal representing a burst address;

first register circuits for storing the first output signals output from said first multiplexer circuits, respectively;

first inverters for inverting the first output signals stored in said first register circuits and inputting the inverted output signals to the first input terminals of said first multiplexer circuits as input signals, respectively;

second multiplexer circuits each having first to third input terminals to receive a decoded address signal at the second input terminal, receive the address signal at the third input terminal, select one of input signals input to the first to third input terminals, and output a second output signal representing the burst address;

second register circuits for storing the second output signals output from said second multiplexer circuits, respectively; and second inverters for inverting the second output signals stored in said second register circuits and inputting the inverted output signals to the first input terminals of said second multiplexer circuits as input signals, respectively.

8. A counter according to claim 7, wherein storage of the first output signal by said first register circuit and storage of the second output signal by said second register circuit are performed on the basis of a clock signal.

9. A counter according to claim 7, wherein when a burst address in a linear mode of double data rate scheme is to be generated, said first and second multiplexer circuits are controlled to select the input signals to the second input terminals of said first and second multiplexer circuits at the start of the burst address generation operation and then select the input signals to the first input terminals, and when a burst address in an interleave mode of double data rate scheme is to be generated, said first and second multiplexer circuits are controlled to select the input signals to the second input terminals of said first multiplexer circuits and input signals to the third input terminals of said second multiplexer circuits at the start of the burst address generation operation and then the input signals to the first input terminals.

10. A semiconductor memory device including the burst address counter according to claim 7, comprising:

a memory cell array in which a plurality of memory cells are arrayed in a matrix;

a plurality of data buses through which data to be read/written from/in the memory cells propagate;

a read/write control circuit for controlling a data read/write from/in memory cells in said memory cell array, which correspond to two consecutive addresses, and parallelly processing the data between said read/write control circuit and said plurality of data buses;

a memory cell selection circuit for selecting the memory cells in said memory cell array in accordance with the address signal containing the output signals representing a burst address output from said burst address counter;

a column transfer gate group controlled by said memory cell selection circuit to select a column in said memory cell array;

a first data line for outputting data read out from a plurality of memory cells selected when a predetermined column address signal bit of the address signal is at "0" through said column transfer gate group;

a second data line for outputting data read out from a plurality of memory cells selected when the predetermined column address signal bit is at "1" through said column transfer gate group;

a first sense amplifier for amplifying the data read out from the memory cells and a first data write circuit for writing data in the memory cells, said first sense amplifier and said first data write circuit being connected to said first data line and having an active period controlled by a column address signal bit other than the predetermined column address signal bit;

a second sense amplifier for amplifying the data read out from the memory cells and a second data write circuit for writing data in the memory cells, said second sense amplifier and said second data write circuit being connected to said second data line and having an active period controlled by the column address signal bit other than the predetermined column address signal bit;

a first data bus commonly connected to a plurality of sets of first sense amplifiers and first data write circuits having different active periods; and a second data bus commonly connected to a plurality of sets of second sense amplifiers and second data write circuits having different active periods.

11. A semiconductor memory device according to claim 10, wherein the memory cell comprises a static memory cell.

12. A semiconductor memory device comprising:

a memory cell array;

a burst address counter for generating a burst address signal as part of a column address signal for designating a column address of said memory cell array on the basis of external address signals; and a circuit for selecting a memory cell in said memory cell array on the basis of the address signals and the burst address signal output from said burst address counter, wherein said burst address counter comprises:

first multiplexer circuits each having first and second input terminals to receive an address signal at the second input terminal, select one of input signals input to the first and second input terminals, and output a first output signal representing a burst address;

first register circuits for storing the first output signals output from said first multiplexer circuits, respectively;

first inverters for inverting the first output signals stored in said first register circuits and inputting the inverted output signals to the first input terminals of said first multiplexer circuits as input signals, respectively;

second multiplexer circuits each having first to third input terminals to receive a decoded address signal at the second input terminal, receive the address signal at the third input terminal, select one of input signals input to the first to third input terminals, and output a second output signal representing the burst address;

second register circuits for storing the second output signals output from said second multiplexer circuits, respectively; and second inverters for inverting the second output signals stored in said second register circuits and inputting the inverted output signals to the first input terminals of said second multiplexer circuits as input signals, respectively.

13. A burst address counter comprising:

first to fourth decoder circuits of a first group for decoding address signals;

first to fourth decoder circuits of a second group for decoding the address signals;

first to fourth multiplexer circuits of a first group each having first to third input terminals to receive decoded output signals from said first to fourth decoder circuit of the first group at the first input terminals, respectively, receive the decoded output signals from said first to fourth decoder circuit of the second group at the second input terminals, respectively, and selectively output one of input signals to the first to third input terminals on the basis of a first multiplexer control signal as output signals representing a burst address;

first to fourth multiplexer circuits of a second group each having first to third input terminals to selectively output one of input signals to the first to third input terminals on the basis of a second multiplexer control signal as output signals to the third input terminals of the first to fourth multiplexer circuits of the first group, respectively;

first to fourth register circuits for storing the output signals from said first to fourth multiplexer circuits of the first group, respectively;

a first interconnection used in linear and interleave modes of single data rate scheme and connected to input an output signal from said first register circuit to the first input terminal of said fourth multiplexer circuit of the second group and output signals from said second to fourth register circuits to the first input terminals of said first to third multiplexer circuits of the second group, respectively;

a second interconnection used in the interleave mode of single data rate scheme and connected to input the output signals from said first to third register circuits to the second input terminals of said second to fourth multiplexer circuits of the second group, respectively, and the output signal from said fourth register circuit to the second input terminal of said first multiplexer circuit of the second group; and first to fourth inverter circuits used in linear and interleave modes of double data rate scheme to invert the output signals from said first to fourth register circuits and input the inverted output signals to the third input terminals of said first to fourth multiplexer circuits of the second group, respectively, as input signals.

14. A counter according to claim 13, wherein each of said first to fourth multiplexer circuits of the first group selects one of an input signal to the first input terminal and an input signal to the second input terminal at the start of the burst address generation operation to receive a start address, presets the start address in a corresponding one of said first to fourth register circuits, and then selects an input signal to the third input terminal, and each of said first to fourth multiplexer circuits of the second group selects one of input signals to the first to third input terminals in accordance with a burst address generation mode.

15. A semiconductor memory device including the burst address counter according to claim 13, comprising:

a memory cell array in which a plurality of memory cells are arrayed in a matrix;

a plurality of data buses through which data to be read/written from/in the memory cells propagate;

a read/write control circuit for controlling a data read/write from/in memory cells in said memory cell array, which correspond to two consecutive addresses, and parallelly processing the data between said read/write control circuit and said plurality of data buses;

a memory cell selection circuit for selecting the memory cells in said memory cell array in accordance with the address signal containing the output signals representing a burst address output from said burst address counter;

a column transfer gate group controlled by said memory cell selection circuit to select a column in said memory cell array;

a first data line for outputting data read out from a plurality of memory cells selected when a predetermined column address signal bit of the address signal is at "0" through said column transfer gate group;

a second data line for outputting data read out from a plurality of memory cells selected when the predetermined column address signal bit is at "1" through said column transfer gate group;

a first sense amplifier for amplifying the data read out from the memory cells and a first data write circuit for writing data in the memory cells, said first sense amplifier and said first data write circuit being connected to said first data line and having an active period controlled by a column address signal bit other than the predetermined column address signal bit;

a second sense amplifier for amplifying the data read out from the memory cells and a second data write circuit for writing data in the memory cells, said second sense amplifier and said second data write circuit being connected to said second data line and having an active period controlled by the column address signal bit other than the predetermined column address signal bit;

a first data bus commonly connected to a plurality of sets of first sense amplifiers and first data write circuits having different active periods; and a second data bus commonly connected to a plurality of sets of second sense amplifiers and second data write circuits having different active periods.

16. A semiconductor memory device according to claim 15,
wherein the memory cell comprises a static memory cell.

17. A semiconductor memory device comprising:
a memory cell array;
a burst address counter for generating a burst address signal as part of a column address signal for designating a column address of said memory cell array on the basis of external address signals; and
a circuit for selecting a memory cell in said memory cell array on the basis of the address signals and the burst address signal output from said burst address counter,
wherein said burst address counter comprises:
first to fourth decoder circuits of a first group for decoding address signals;
first to fourth decoder circuits of a second group for decoding the address signals;
first to fourth multiplexer circuits of a first group each having first to third input terminals to receive decoded output signals from said first to fourth decoder circuit of the first group at the first input terminals, respectively, receive the decoded output signals from said first to fourth decoder circuit of the second group at the second input terminals, respectively, and selectively output one of input signals to the first to third input terminals on the basis of a first multiplexer control signal as output signals representing a burst address;
first to fourth multiplexer circuits of a second group each having first to third input terminals to selectively output one of input signals to the first to third input terminals on the basis of a second multiplexer control signal as output signals to the third input terminals of the first to fourth multiplexer circuits of the first group, respectively;
first to fourth register circuits for storing the output signals from said first to fourth multiplexer circuits of the first group, respectively;
a first interconnection used in linear and interleave mode of single data rate scheme and connected to input an output signal from said first register circuit to the first input terminal of said fourth multiplexer circuit of the second group and output signals from said second to fourth register circuits to the first input terminals of said first to third multiplexer circuits of the second group, respectively;
a second interconnection used in the interleave mode of single data rate scheme and connected to input the output signals from said first to third register circuits to the second input terminals of said second to fourth multiplexer circuits of the second group, respectively, and the output signal from said fourth register circuit to the second input terminal of said first multiplexer circuit of the second group; and
first to fourth inverter circuits used in linear and interleave modes of double data rate scheme to invert the output signals from said first to fourth register circuits and input the inverted output signals to the third input terminals of said first to fourth multiplexer circuits of the second group, respectively, as input signals.

18. A burst address counter comprising:
multiplexer circuits each having first and second input terminals to selectively output one of inputs to the first and second input terminals on the basis of a multiplexer control signal;
register circuits storing output signals from said multiplexer circuits, respectively;
inverter circuits for inverting output signals from said register circuits and inputting the inverted output signals to the first input terminals of said multiplexer circuits, respectively; and
decoder circuits for decoding address signals and inputting the decoded address signals to the second input terminals of some of said multiplexer circuits, respectively.

19. A semiconductor memory device including the burst address counter according to claim 18, comprising:
a memory cell array in which a plurality of memory cells are arrayed in a matrix;
a plurality of data buses through which data to be read/written from/in the memory cells propagate;
a read/write control circuit for controlling a data read/write from/in memory cells in said memory cell array, which correspond to two consecutive addresses, and parallelly processing the data between said read/write control circuit and said plurality of data buses;
a memory cell selection circuit for selecting the memory cells in said memory cell array in accordance with the address signal containing the output signals representing a burst address output from said burst address counter;
a column transfer gate group controlled by said memory cell selection circuit to select a column in said memory cell array;
a first data line for outputting data read out from a plurality of memory cells selected when a predetermined column address signal bit of the address signal is at "0" through said column transfer gate group;
a second data line for outputting data read out from a plurality of memory cells selected when the predetermined column address signal bit is at "1" through said column transfer gate group;
a first sense amplifier for amplifying the data read out from the memory cells and a first data write circuit for writing data in the memory cells, said first sense amplifier and said first data write circuit being connected to said first data line and having an active period controlled by a column address signal bit other than the predetermined column address signal bit;

a second sense amplifier for amplifying the data read out from the memory cells and a second data write circuit for writing data in the memory cells, said second sense amplifier and said second data write circuit being connected to said second data line and having an active period controlled by the column address signal bit other than the predetermined column address signal bit;

a first data bus commonly connected to a plurality of sets of first sense amplifiers and first data write circuits having different active periods; and a second data bus commonly connected to a plurality of sets of second sense amplifiers and second data write circuits having different active periods.

20. A semiconductor memory device according to claim 19, wherein the memory cell comprises a static memory cell.

21. A semiconductor memory device comprising:

a memory cell array;

a burst address counter for generating a burst address signal as part of a column address signal for designating a column address of said memory cell array on the basis of external address signals; and a circuit for selecting a memory cell in said memory cell array on the basis of the address signals and the burst address signal output from said burst address counter, wherein said burst address counter comprises:

multiplexer circuits each having first and second input terminals to selectively output one of inputs to the first and second input terminals on the basis of a multiplexer control signal;

register circuits storing output signals from said multiplexer circuits, respectively;

inverter circuits for inverting output signals from said register circuits and inputting the inverted output signals to the first input terminals of said multiplexer circuits, respectively; and decoder circuits for decoding address signals and inputting the decoded address signals to the second input terminals of some of said multiplexer circuits, respectively.

\* \* \* \* \*